United States Patent
Sakai

(10) Patent No.: US 10,728,058 B2
(45) Date of Patent: Jul. 28, 2020

(54) DECISION FEEDBACK EQUALIZER AND INTERCONNECT CIRCUIT

(71) Applicant: FUJITSU LIMITED, Kawasaki-shi, Kanagawa (JP)

(72) Inventor: Yasufumi Sakai, Fuchu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/451,225

(22) Filed: Jun. 25, 2019

(65) Prior Publication Data
US 2019/0312757 A1 Oct. 10, 2019

Related U.S. Application Data

(63) Continuation of application No. PCT/JP2018/000175, filed on Jan. 9, 2018.

(30) Foreign Application Priority Data

Jan. 31, 2017 (JP) .................................. 2017-015934

(51) Int. Cl.
| | |
|---|---|
| H04L 25/03 | (2006.01) |
| H03K 3/037 | (2006.01) |
| H03K 5/003 | (2006.01) |
| H03K 5/24 | (2006.01) |
| H04B 3/04 | (2006.01) |

(52) U.S. Cl.
CPC ....... *H04L 25/03057* (2013.01); *H03K 3/037* (2013.01); *H03K 5/003* (2013.01); *H03K 5/24* (2013.01); *H04B 3/04* (2013.01); *H04L 25/03* (2013.01)

(58) Field of Classification Search
CPC .................................................. H04L 25/03057
USPC ........................................................... 375/233
See application file for complete search history.

(56) References Cited

U.S. PATENT DOCUMENTS

| | | | | | |
|---|---|---|---|---|---|
| 4,918,399 | A | * | 4/1990 | Devecchi ............ | H03F 3/45475 330/253 |
| 5,956,502 | A | * | 9/1999 | Manning ................ | H03K 23/54 713/503 |

(Continued)

FOREIGN PATENT DOCUMENTS

| | | |
|---|---|---|
| JP | 2005-341582 | 12/2005 |
| JP | 2015-228540 | 12/2015 |
| JP | 2016-123056 | 7/2016 |
| WO | 2009/113462 | 9/2009 |

OTHER PUBLICATIONS

US 9,401,700 B1, 07/2016, Euhan (withdrawn)

(Continued)

*Primary Examiner* — Lihong Yu
(74) *Attorney, Agent, or Firm* — Fujitsu Patent Center

(57) ABSTRACT

A decision feedback equalizer includes: a comparison circuit; a latch circuit configured to latch a result of comparison by the comparison circuit; a setting circuit configured to set a decision threshold of the comparison circuit in accordance with a control signal; and a switch circuit configured to be controlled to be turned on and off by an output signal from the latch circuit, wherein the setting circuit is configured to be connected in parallel with an input stage of the comparison circuit through the switch circuit and operate in synchronization with a clock signal for driving the comparison circuit.

14 Claims, 27 Drawing Sheets

(56) References Cited

U.S. PATENT DOCUMENTS

| | | | |
|---|---|---|---|
| 6,850,583 B1* | 2/2005 | Matsumura | H04L 7/0334 |
| | | | 327/158 |
| 9,571,115 B1* | 2/2017 | Beukema | H03M 1/1023 |
| 9,960,705 B1* | 5/2018 | Pidutti | H02M 7/217 |
| 2005/0265440 A1 | 12/2005 | Sohn | |
| 2010/0327924 A1 | 12/2010 | Hasegawa et al. | |
| 2013/0243071 A1* | 9/2013 | Chmelar | H04L 25/063 |
| | | | 375/233 |
| 2015/0256362 A1* | 9/2015 | Ganzerli | H04L 25/03057 |
| | | | 375/233 |
| 2015/0349758 A1 | 12/2015 | Chen | |
| 2016/0191276 A1 | 6/2016 | Sakai et al. | |
| 2018/0183332 A1* | 6/2018 | Herzer | H02M 3/158 |

OTHER PUBLICATIONS

Sam Palermo, "ECEN689: Special Topics in High-Speed Links Circuits and Systems", Spring 2010, Class Notes Lecture 19, Texas A&M University, (pp. 1-19).

T. Shibasaki, et al., "A 56-Gb/s Receiver Front-End with a CTLE and 1-Tap DFE in 20-nm CMOS", IEEE Symp. VLSI Circuits, pp. 112-113, Jun. 2014 (2 pages).

Written Opinion of the International Searching Authority mailed in connection with PCT/JP2018/000175 and dated Mar. 27, 2018, with partial English translation (11 pages).

G. Puvaneswari et al., "Analysis of Energy Efficient Double Tail Regenerative Comparators", Circuit, Power and Computing Technologies (ICCPCT), Mar. 18, 2016, (pp. 1-5), Cited in ISR.

* cited by examiner

DECISION FEEDBACK EQUALIZER AND INTERCONNECT CIRCUIT

CROSS-REFERENCE TO RELATED APPLICATION

This application is a continuation application of International Application PCT/JP2018/000175 filed on Jan. 9, 2018 and designated the U.S., the entire contents of which are incorporated herein by reference. The International Application PCT/JP2018/000175 is based upon and claims the benefit of priority of the prior Japanese Patent Application No. 2017-015934, filed on Jan. 31, 2017, the entire contents of which are incorporated herein by reference.

FIELD

The embodiments discussed herein are related to a decision feedback equalizer and an interconnect circuit.

BACKGROUND

Recently, in an information processing device such as a server or a computer, the capability (bandwidth, in particular) of a component such as a central processing unit (CPU) has been largely improved. To improve the total bandwidth of the entire information processing device, speeding-up is requested for a communication circuit configured to communicate data between chips such as CPUs, between a plurality of elements in each chip, or between a plurality of circuit blocks in some cases. Speeding-up is also requested for a communication circuit configured to communicate data between boards or bodies in some cases. In such a communication circuit for which fast data communication through electrical communication or optical communication is requested, for example, a signal equalizer (equalizer) is used to compensate data signal degradation occurring on a communication path.

One of such equalizers is a decision feedback equalizer (DFE). The DFE is an equalizer configured to reduce the influence of inter symbol interference (ISI) superimposed on a data signal. At each decision of an input data signal by a comparator, the DFE directly subtracts the ISI from the data signal by changing a decision threshold of the comparator by an amount determined in accordance with a weighted sum of a "past decision result" and a "coefficient (DFE coefficient) set from the outside". Thus, the opening amount of an eye increases as the DFE coefficient is closer to the value of the ISI, and the influence of the ISI is reduced accordingly.

In a DFE of a disclosed conventional technology, a weighting adder is incorporated inside a comparator. In the conventional technology, the DFE coefficient is set by changing the number of transistors turned on in accordance with an external digital control signal, the transistors connecting latches included in the comparator and a power source.

Examples of the related art include Japanese Laid-open Patent Publication No. 2005-341582, International Publication Pamphlet No. WO 2009/113462, Sam Palermo, ECEN689: Special Topics in High-Speed Links Circuits and Systems, Spring 2010, Class Notes Lecture 19, Texas A & M University, and T. Shibasaki, et al., "A 56-Gb/s Receiver Front-End with a CTLE and 1-Tap DFE in 20-nm CMOS", IEEE Symp. VLSI Circuits, pp. 112-113, June 2014.

SUMMARY

According to an aspect of the embodiments, a decision feedback equalizer includes: a comparison circuit; a latch circuit configured to latch a result of comparison by the comparison circuit; a setting circuit configured to set a decision threshold of the comparison circuit in accordance with a control signal; and a switch circuit configured to be controlled to be turned on and off by an output signal from the latch circuit, wherein the setting circuit is configured to be connected in parallel with an input stage of the comparison circuit through the switch circuit and operate in synchronization with a clock signal for driving the comparison circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In the conventional technology of T. Shibasaki, et al., "A 56-Gb/s Receiver Front-End with a CTLE and 1-Tap DFE in 20-nm CMOS", IEEE Symp. VLSI Circuits, pp. 112-113, June 2014, since the on-resistance of an inverter (R of the RC time constant of the inverter) included in a latch is changed in accordance with the external digital control signal, the RC time constant of the inverter non-linearly changes with the on-resistance of the inverter. Thus, the decision threshold of the comparator non-linearly changes with the number of transistors turned on. Accordingly, the DFE coefficient non-linearly changes with the external digital control signal. As a result, it is difficult to set the DFE coefficient to be equal to the value of the ISI where the resolution of the DFE coefficient, which is set in accordance with the external digital control signal, is relatively large. Accordingly, the DFE capability of removing the ISI decreases in some cases.

Thus, an aspect of the present disclosure is intended to provide a decision feedback equalizer and an interconnect circuit that achieve improvement of ISI removal capability.

Embodiments will be described below with reference to the accompanying drawings.

<Interconnect Circuit>

Figure 1:
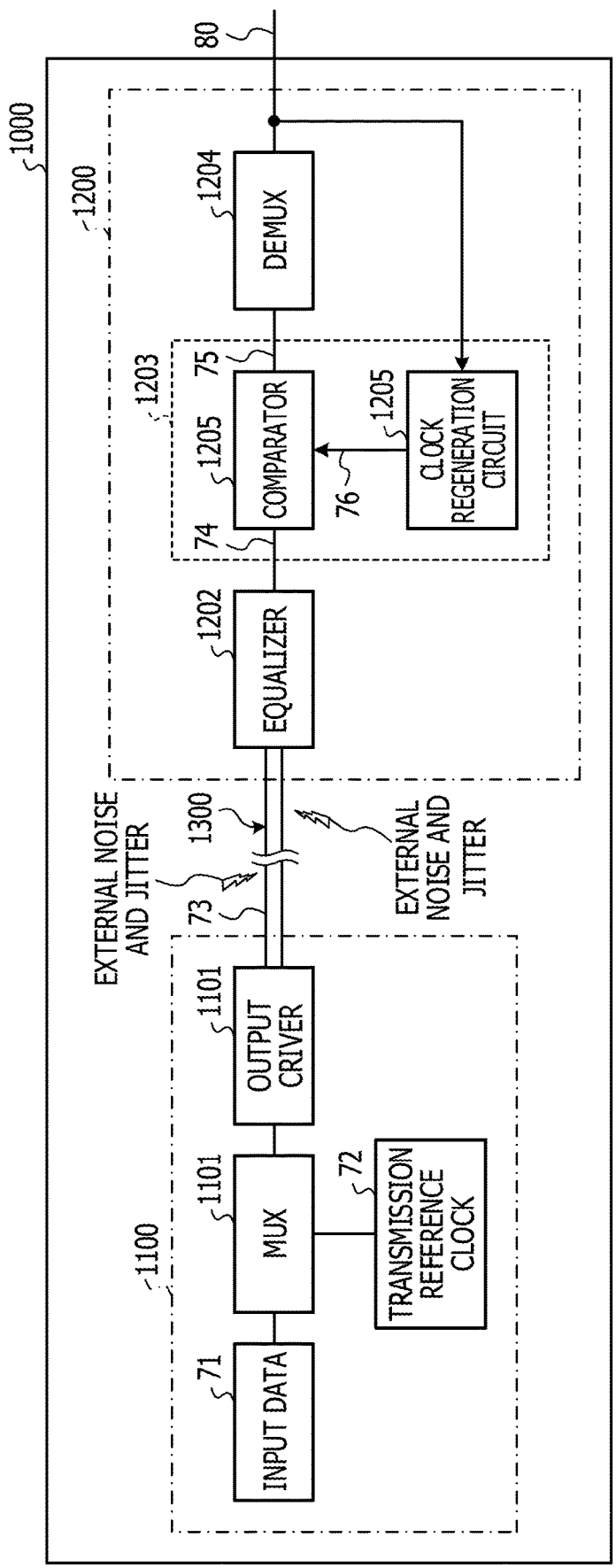
FIG. 1 is a diagram illustrating an exemplary configuration of an interconnect circuit according to an embodiment.

FIG. 1 is a diagram illustrating an exemplary configuration of an interconnect circuit 1000. In the interconnect circuit 1000, data signals communicated between a transmission device 1100 and a reception device 1200 through a transmission line 1300 are transmitted by fast serial transmission. The interconnect circuit 1000 is an exemplary communication circuit configured to communicate data between chips such as CPUs, between a plurality of elements in each chip, or between a plurality of circuit blocks. The transmission line 1300 is a wired communication path but may be a wireless communication path.

The interconnect circuit 1000 includes the transmission device 1100, the reception device 1200, and the transmission line 1300. The transmission device 1100 and the reception device 1200 are connected with each other through the transmission line 1300. The transmission device 1100 includes a multiplexer circuit (MUX) 1101 and an output driver 1102. The reception device 1200 includes an equalizer 1202, a reception processing unit 1203, and a demultiplexer circuit (DEMUX) 1204. The reception processing unit 1203 includes a comparator 1205 and a clock regeneration circuit (CR) 1206.

An output from the MUX 1101 configured to set input data 71 in accordance with a transmission reference clock 72 is input to the output driver 1102. The output driver 1102 transmits an output signal 73 to the reception device 1200 through the transmission line 1300. The output signal 73 is shaped by the equalizer 1202 and input to the comparator 1205.

The comparator 1205 compares an output signal 74 from the equalizer 1202 with a certain threshold and outputs reception data 75. The DEMUX 1204 performs serial-parallel conversion of the reception data 75. The CR 1206 generates, from an output signal 80 from the DEMUX 1204, a clock signal 76 synchronized with the output signal 74 from the equalizer 1202, and supplies the clock signal 76 to the comparator 1205.

The equalizer 1202 is an exemplary decision feedback equalizer according to the present embodiment. The following describes the decision feedback equalizer according to the present embodiment.

First Embodiment

Figure 2:
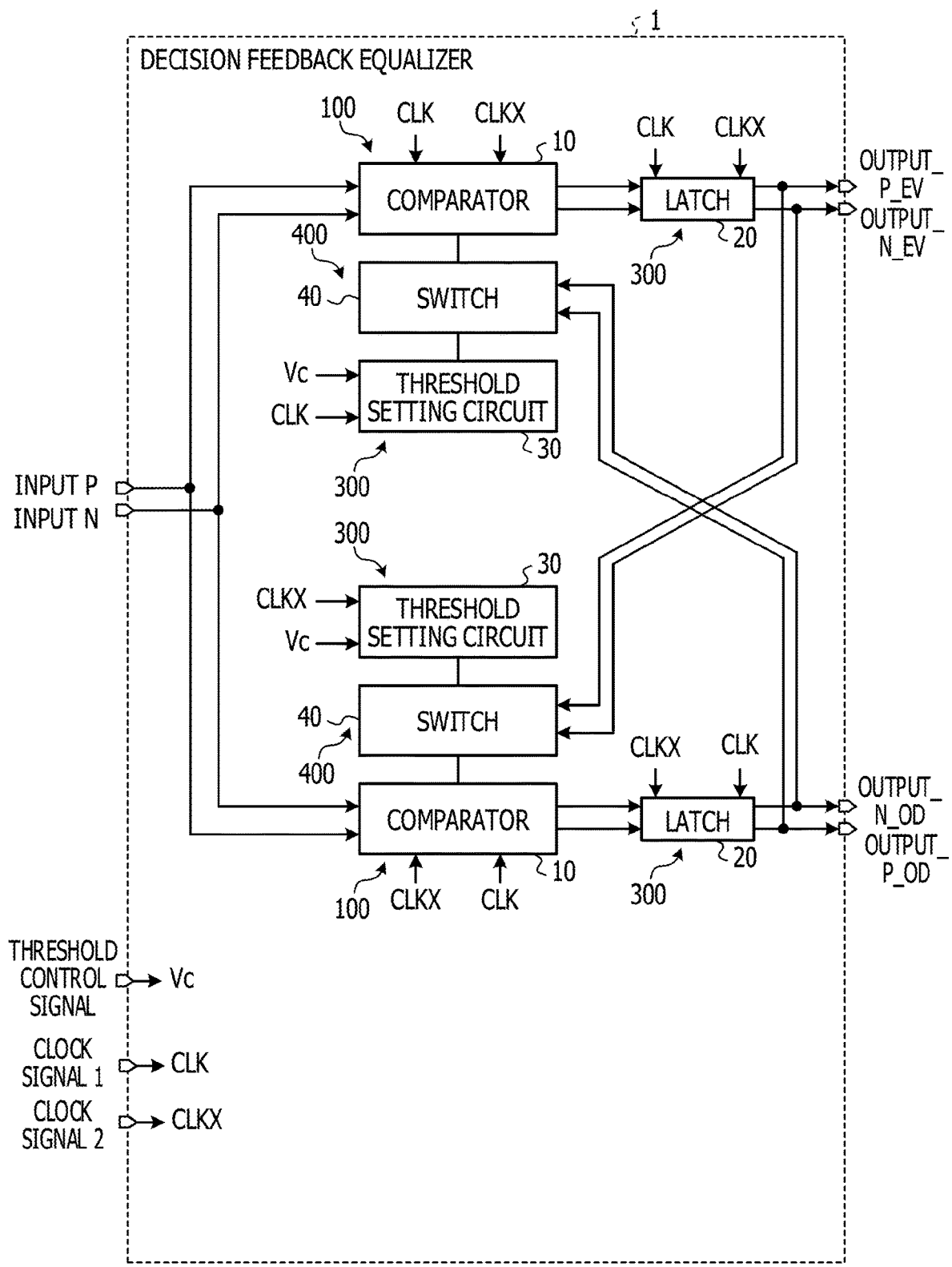
FIG. 2 is a diagram illustrating an exemplary configuration of a decision feedback equalizer according to a first embodiment.

FIG. 2 is a diagram illustrating an exemplary configuration of a decision feedback equalizer according to a first embodiment. An equalizer 1 illustrated in FIG. 2 is an exemplary decision feedback equalizer configured to reduce the influence of ISI superimposed on differential data signals P and N input to the equalizer 1. The equalizer 1 includes a comparison circuit 100, a latch circuit 200, a setting circuit 300, and a switch circuit 400. A threshold control signal Vc, a clock signal CLK, and a clock signal CLKX are supplied from the outside of the equalizer 1.

To simplify description, operations of each comparator 10 in the comparison circuit 100 and each latch 20 in the latch circuit 200 are defined as described below.

The comparator 10 has such a differential-input and differential-output configuration with which an input signal and an output signal are differential signals.

The comparator 10 sets a high level to one of two output signals output from the comparator 10 and a low level to the other output signal in accordance with an input signal input to the comparator 10 in an evaluation duration. The comparator 10 sets an identical value to the two output signals output from the comparator 10 in a reset duration.

At a comparator on an even side (in the case of FIG. 2, the upper comparator 10), the reset duration is a duration in which the clock signal CLK input to the comparator 10 is at the low level, and the evaluation duration is a duration in which the clock signal CLK is at the high level. The same applies to a latch on the even side (in the case of FIG. 2, the upper latch 20).

At a comparator on an odd side (in the case of FIG. 2, the lower comparator 10), the reset duration is a duration in which the clock signal CLKX input to the comparator 10 is at the low level, and the evaluation duration is a duration in which the clock signal CLKX is at the high level. The same applies to the latch on the odd side (in the case of FIG. 2, the lower latch 20).

The clock signal CLK and the clock signal CLKX are inverted with respect to each other. Specifically, the clock signal CLKX is at the high level when the clock signal CLK is at the low level, or the clock signal CLKX is at the low level when the clock signal CLK is at the high level.

The latch 20 latches (acquires) an output signal output from the comparator 10 connected before the latch 20 in the evaluation duration. Specifically, in the evaluation duration, the latch 20 latches a result of comparison by the comparator 10 connected before the latch 20, and outputs a latch output signal in accordance with the latched comparison result. In the reset duration of the comparator 10 connected before the latch 20, the latch 20 continues, irrespective of an output signal output from the comparator 10, outputting of the latch output signal in accordance with the comparison result latched in the previous evaluation duration. Accordingly, in the reset duration, the latch 20 keeps holding the result of comparison by the comparator 10 acquired in the previous evaluation duration.

These definitions are applied in the same manner to other embodiments to be described later unless otherwise stated.

The equalizer 1 illustrated in FIG. 2 is a half-rate DFE having a two-parallel time interleaved configuration.

The equalizer 1 includes the comparison circuit 100, the latch circuit 200, the switch circuit 400, and the setting circuit 300. The comparison circuit 100 includes the even-side comparator 10 and the odd-side comparator 10 having configurations identical to each other. The latch circuit 200 includes the even-side latch 20 and the odd-side latch 20 having configurations identical to each other. The switch circuit 400 includes an even-side switch unit 40 and an odd-side switch unit 40 having configurations identical to each other. The setting circuit 300 includes an even-side threshold setting circuit 30 and an odd-side threshold setting circuit 30 having configurations identical to each other.

Hereinafter, the even-side comparator 10, the odd-side comparator 10, the even-side latch 20, and the odd-side latch 20 are also referred to as a comparator 10*e*, a comparator 10*o*, a latch 20*e*, and a latch 20*o*, respectively. Similarly, the even-side switch unit 40, the odd-side switch unit 40, the even-side threshold setting circuit 30, and the odd-side threshold setting circuit 30 are also referred to as a switch unit 40*e*, a switch unit 40*o*, a threshold setting circuit 30*e*, and a threshold setting circuit 300, respectively.

The comparison circuit 100 includes the comparator 10*e* configured to operate in synchronization with the clock signals CLK and CLKX, and the comparator 10*o* configured to operate in synchronization with the clock signals CLKX and CLK. The comparator 10*e* compares the data signal P and the data signal N in the magnitude relation in the evaluation duration in which the clock signal CLK is at the high level, and continues outputting a result of the comparison until the next evaluation duration (in which the clock signal CLK becomes the high level next) starts. The comparator 10*o* compares the data signal P and the data signal N in the magnitude relation in the evaluation duration in which the clock signal CLKX is at the high level, and continues outputting a result of the comparison until the next evaluation duration (in which the clock signal CLKX becomes the high level next) starts.

The latch circuit 200 latches a result of comparison by the comparison circuit 100. The latch circuit 200 includes the latch 20*e* configured to operate in synchronization with the clock signals CLK and CLKX, and the latch 20*o* configured to operate in synchronization with the clock signals CLKX and CLK. The latch 20*e* latches a result of comparison by the comparator 10*e* in the evaluation duration in which the clock signal CLK is at the high level, and continues outputting of a pair of latch output signals (output_P_EV and output_N_EV) in accordance with the latched comparison result until the next evaluation duration starts. The latch 20*o* latches a result of comparison by the comparator 10*o* in the evaluation duration in which the clock signal CLKX is at the high level, and continues outputting of a pair of latch output signals (output_P_OD and output_N_OD) in accordance with the latched comparison result until the next evaluation duration starts.

The switch circuit 400 is controlled to be turned on and off by an output signal from the latch circuit 200. The switch circuit 400 includes the switch unit 40*e* controlled to be turned on and off by the latch output signals (output_P_OD and output_N_OD), and the switch unit 40*o* controlled to be turned on and off by the latch output signals (output_P_EV and output_N_EV).

The setting circuit 300 sets a decision threshold of the comparison circuit 100 in accordance with the threshold control signal Vc supplied from the outside of the equalizer 1. The threshold control signal Vc is an exemplary control signal. The setting circuit 300 includes the threshold setting circuit 30*e* configured to operate in synchronization with the clock signal CLK for driving the comparator 10*e*, and the threshold setting circuit 30*o* configured to operate in synchronization with the clock signal CLKX for driving the comparator 10*o*. The threshold setting circuit 30*e* sets a decision threshold of the comparator 10*e* in accordance with the threshold control signal Vc. The threshold setting circuit 30*o* sets a decision threshold of the comparator 10*o* in accordance with the threshold control signal Vc.

The setting circuit 300 is connected in parallel with an input stage of the comparison circuit 100 through the switch circuit 400. The threshold setting circuit 30*e* is connected in parallel with an input stage of the comparator 10*e* through the switch unit 40*e*. The threshold setting circuit 30*o* is connected in parallel with an input stage of the comparator 10*o* through the switch unit 40*o*.

Figure 3:
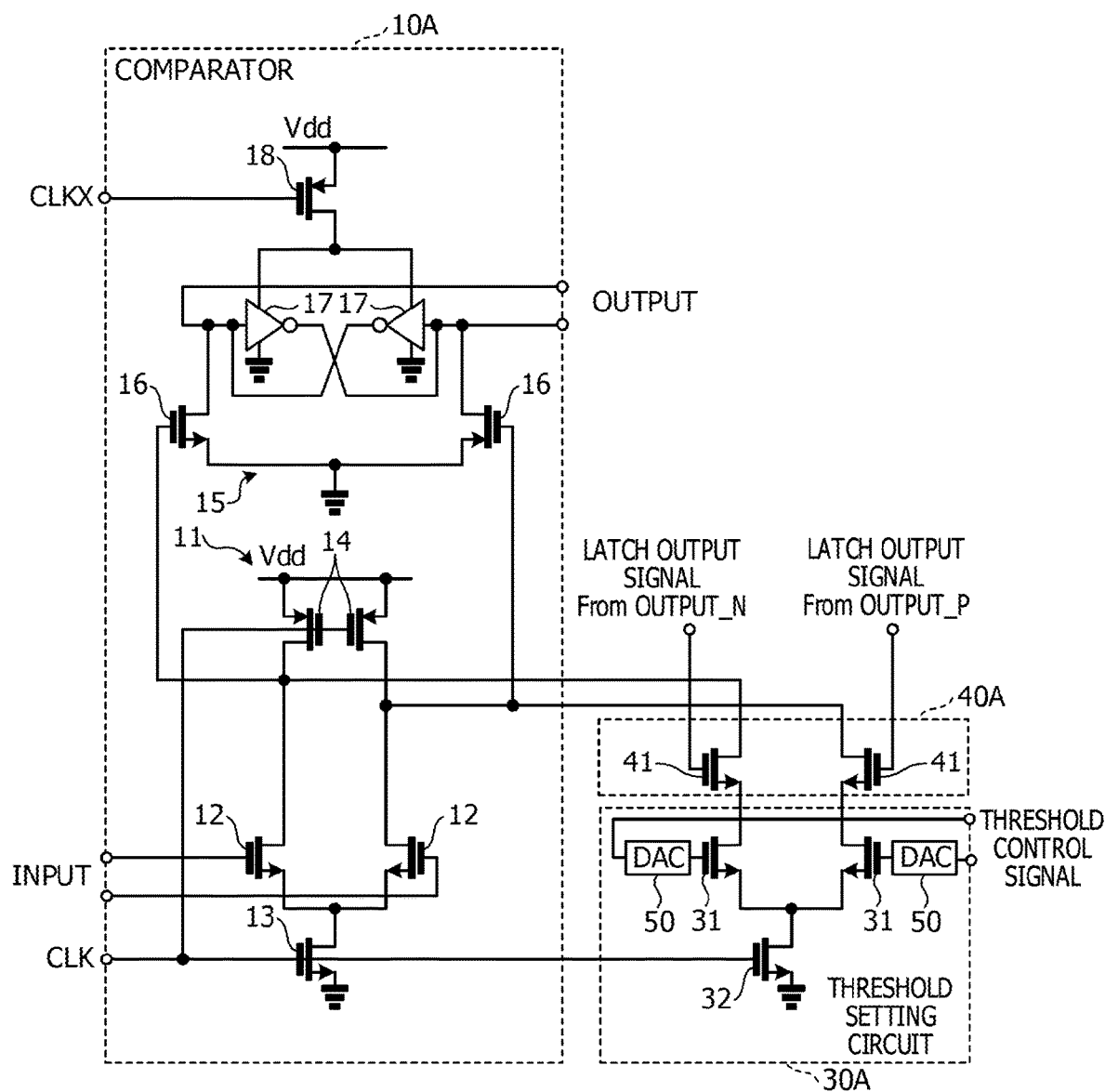
FIG. 3 is a diagram illustrating exemplary configurations of a comparator, a switch unit, and a threshold setting circuit according to the first embodiment.

FIG. 3 is a diagram illustrating exemplary configurations of a comparator, a switch, and a threshold setting circuit according to the first embodiment. A comparator 10A is an exemplary comparator 10, a switch unit 40A is an exemplary switch unit 40, and a threshold setting circuit 30A is an exemplary threshold setting circuit 30.

In the even-side configuration (the comparator 10*e*, the switch unit 40*e*, and the threshold setting circuit 30*e*), the clock signal CLK and the clock signal CLKX are input as illustrated in FIG. 3. However, in the odd-side configuration (the comparator 10*o*, the switch unit 40*o*, and the threshold setting circuit 30*o*), the clock signal CLK illustrated in FIG. 3 is replaced with the clock signal CLKX, and the clock signal CLKX illustrated in FIG. 3 is replaced with the clock signal CLK.

The following description is made on the even-side configuration unless otherwise stated, and description of the odd-side configuration is omitted with reference to the description of the even-side configuration. The omission also applies to the other embodiments to be described later.

In FIG. 3, the comparator 10A is a double-tail latch comparator. The comparator 10A includes an input stage 11 and an output stage 15.

The input stage 11 includes a pair of transistors 12 to which the data signals P and N are input, respectively, a transistor 13 to which the clock signal CLK is input, and a pair of transistors 14 to which the clock signal CLK is input. The transistor 13 connects each of the pair of transistors 12 and the ground. Each of the pair of transistors 14 connects the corresponding one of the pair of transistors 12 and a power potential Vdd.

The output stage 15 latches and outputs a result of comparison at the input stage 11. The output stage 15 includes a pair of transistors 16, a pair of inverters 17, and a transistor 18. The input (specifically, gate) of each of the pair of transistors 16 is connected with a node between the corresponding one of the pair of transistors 12 and the corresponding one of the pair of transistors 14. Each of the pair of transistors 16 connects the corresponding one of a pair of outputs of the comparator 10A and the ground. The pair of outputs of the comparator 10A are connected with the pair of inverters 17 forming a latch. The transistor 18 to which the clock signal CLKX is input connects each of the pair of inverters 17 and the power potential Vdd. The pair of outputs of the comparator 10A are connected with the latch 20 (refer to FIG. 2).

In FIG. 3, the switch unit 40A includes a pair of transistors 41 connected in parallel with the input stage 11 of the comparator 10A. The transistor 41 to which the latch output signal (output_P_OD) is input has one end connected with a node between one of the transistors 14 and one of the transistors 12. The transistor 41 to which the latch output signal (output_N_OD) is input has one end connected with a node between the other transistor 14 and the other transistor 12.

In FIG. 3, the threshold setting circuit 30A is connected in parallel with the input stage 11 of the comparator 10A through the switch unit 40A. The threshold setting circuit 30A includes, for example, a transistor 32, a pair of threshold adjustment transistors 31, and a pair of DACs (digital-to-analog converters) 50.

The clock signal CLK is input to the transistor 32. The transistor 32 connects each of the pair of threshold adjustment transistors 31 and the ground.

The pair of threshold adjustment transistors 31 are connected in series with the switch unit 40A and connected in parallel with the input stage 11 of the comparator 10A through the switch unit 40A. The pair of threshold adjustment transistors 31 are controlled through the pair of DACs 50 in accordance with the threshold control signal Vc. One of the threshold adjustment transistors 31 is connected in series with one of the transistors 41 and controlled through one of the DACs 50 in accordance with the threshold control signal Vc. One of the threshold adjustment transistors 31 is connected with a node between one of the transistors 14 and one of the transistors 12 through one of the transistors 41. The other threshold adjustment transistor 31 is connected in series with the other transistor 41 and controlled through the other DAC 50 in accordance with the threshold control signal Vc. The other threshold adjustment transistor 31 is connected with a node between the other transistor 14 and the other transistor 12 through the other transistor 41.

The pair of DACs 50 are exemplary digital-analog converters configured to control the pair of threshold adjustment transistors 31 in accordance with the threshold control signal Vc. The pair of DACs 50 convert the threshold control signal Vc that is digital into a threshold control voltage that is analog, and control the gates of the pair of threshold adjustment transistors 31 by the converted threshold control voltage. The threshold control voltage is an exemplary control voltage having a voltage value that linearly changes with the control signal.

In FIG. 3, the transistors 12, 13, 16, 31, 32, and 41 are each, for example, an N-channel metal oxide semiconductor field effect transistor (MOSFET). The transistors 14 and 18 are each, for example, a P-channel MOSFET.

Figure 4:
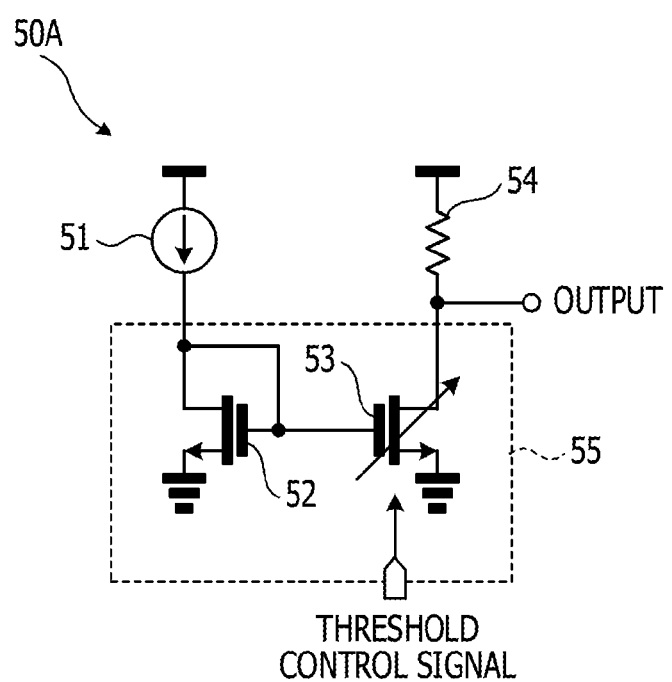
FIG. 4 is a diagram illustrating an exemplary configuration of a DAC.

FIG. 4 is a diagram illustrating an exemplary configuration of each DAC. Each DAC 50A is an exemplary DAC 50. The DAC 50A includes a constant-current source 51, a current mirror circuit 55, and a load resistor 54. The current mirror circuit 55 proportionally changes copy target output current for reference source current (constant current generated by the constant-current source 51) in accordance with the threshold control signal Vc. The current mirror circuit 55 outputs a threshold control voltage having a voltage value that linearly changes with the threshold control signal Vc.

The current mirror circuit 55 includes, for example, at least one input-side transistor 52 and a plurality of output-side transistors 53. The current mirror circuit 55 outputs the threshold control voltage having a voltage value that linearly changes with the threshold control signal Vc that is digital as the number of transistors 53 turned on linearly changes in accordance with the threshold control signal Vc that is digital.

Figure 5:
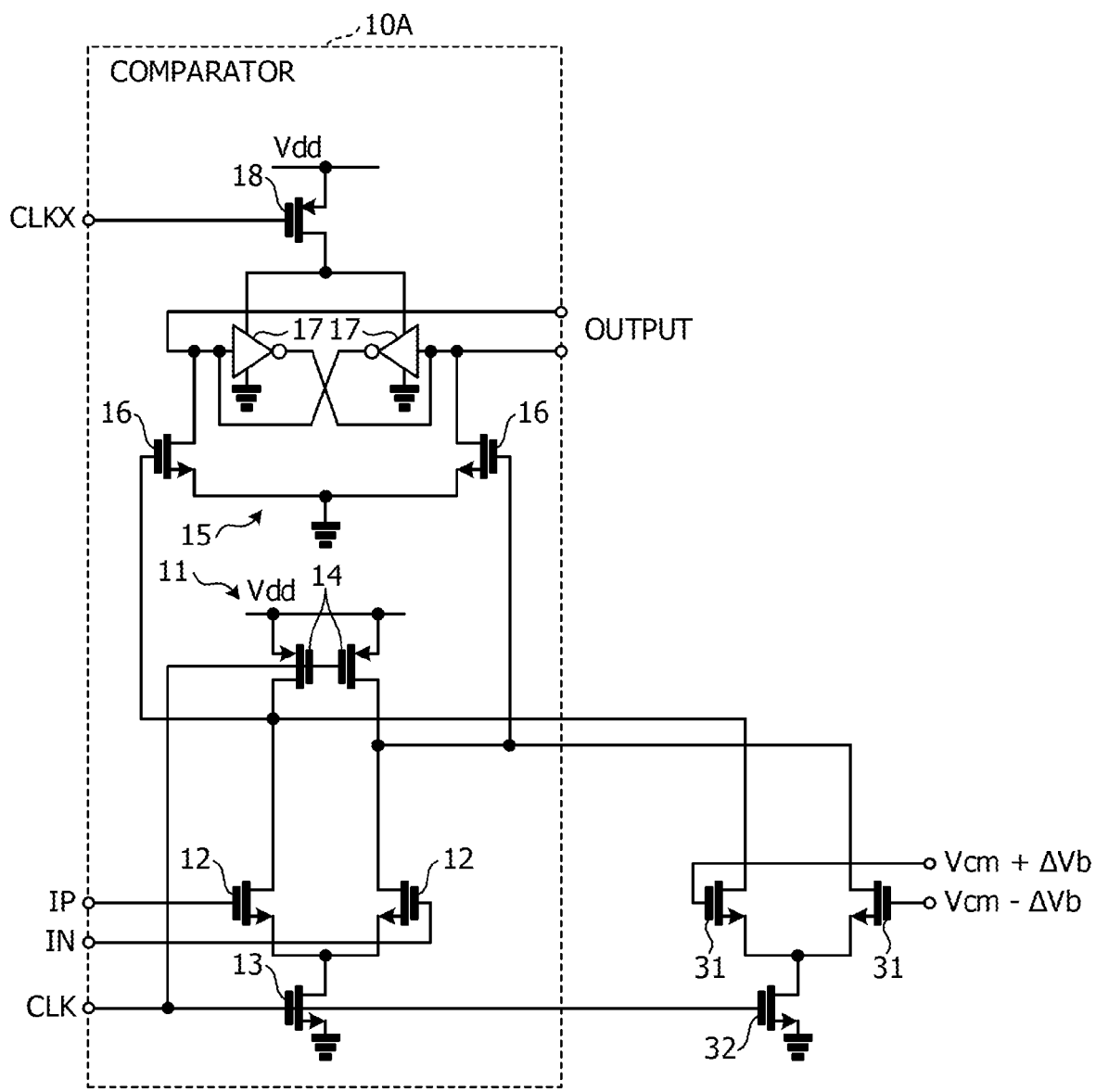
FIG. 5 is a diagram illustrating an exemplary configuration in which an input stage of the comparator is connected in parallel with a transistor.
Figure 6:
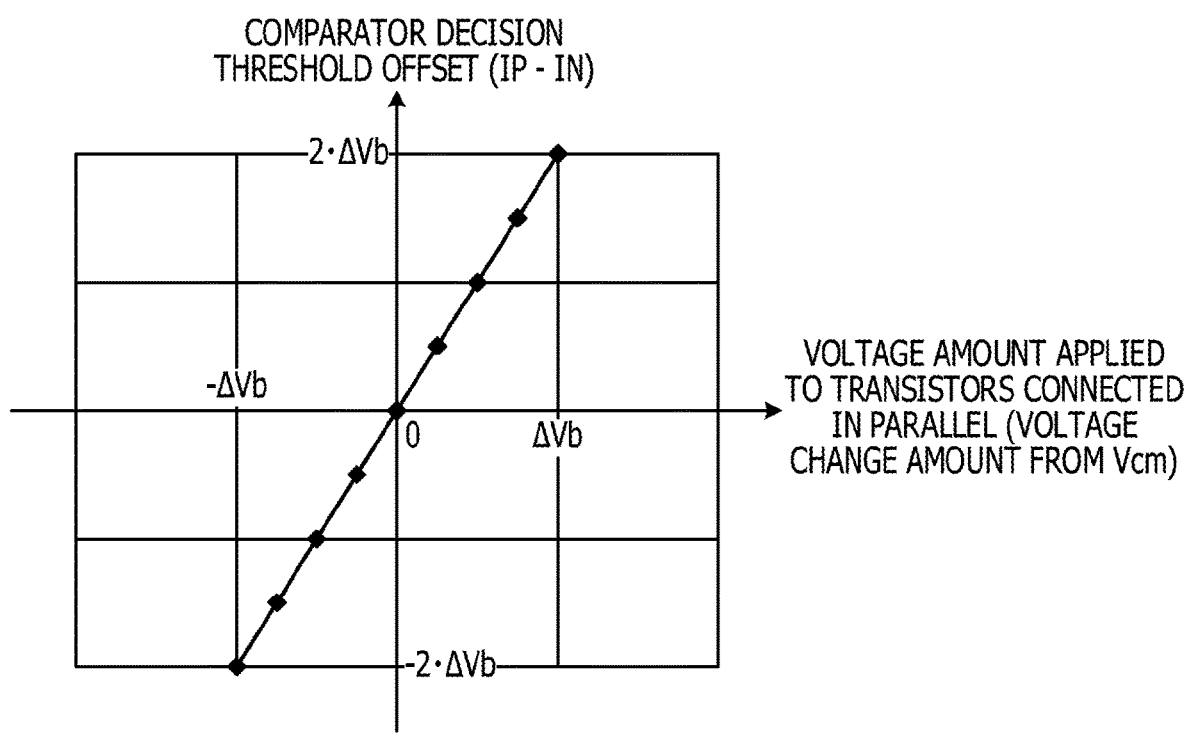
FIG. 6 is a diagram illustrating an exemplary relation between the value of voltage applied to the gate of the transistor connected in parallel and an offset of a decision threshold voltage of the comparator.

FIG. 5 is a diagram illustrating an exemplary configuration in which the input stage 11 of the comparator 10A is connected in parallel with a pair of transistors 31. FIG. 6 is a diagram illustrating an exemplary relation between the value of voltage applied to the gates of the pair of transistors 31 connected in parallel the input stage 11 and the offset (IP-IN) of the decision threshold of the comparator 10A.

Vcm is an operating point of a differential signal input to the comparator 10A. As illustrated in FIGS. 5 and 6, in the configuration in which the pair of transistors 31 are connected in parallel with the input stage 11 of the comparator 10A, the offset (IP-IN) of the decision threshold of the comparator 10A is proportional to the value $\Delta Vb$ of voltage applied to the gates of the pair of transistors 31.

Thus, in the configuration in which the threshold setting circuit 30A is connected in parallel with the input stage 11 of the comparator 10A as illustrated in FIG. 3, the decision threshold of the comparator 10A can be linearly changed in accordance with the threshold control signal Vc. For example, the threshold setting circuit 30A uses the DACs 50 that output the threshold control voltage having a voltage value that linearly changes with the threshold control signal Vc that is digital. The threshold setting circuit 30A controls the gate of each transistor 31 connected in parallel with the input stage 11 by the threshold control voltage output from the corresponding DAC 50. Accordingly, the DFE coefficient of the comparator 10A linearly changes with the threshold control signal Vc that is digital, and thus the decision threshold of the comparator 10A can be linearly changed.

Figure 7:
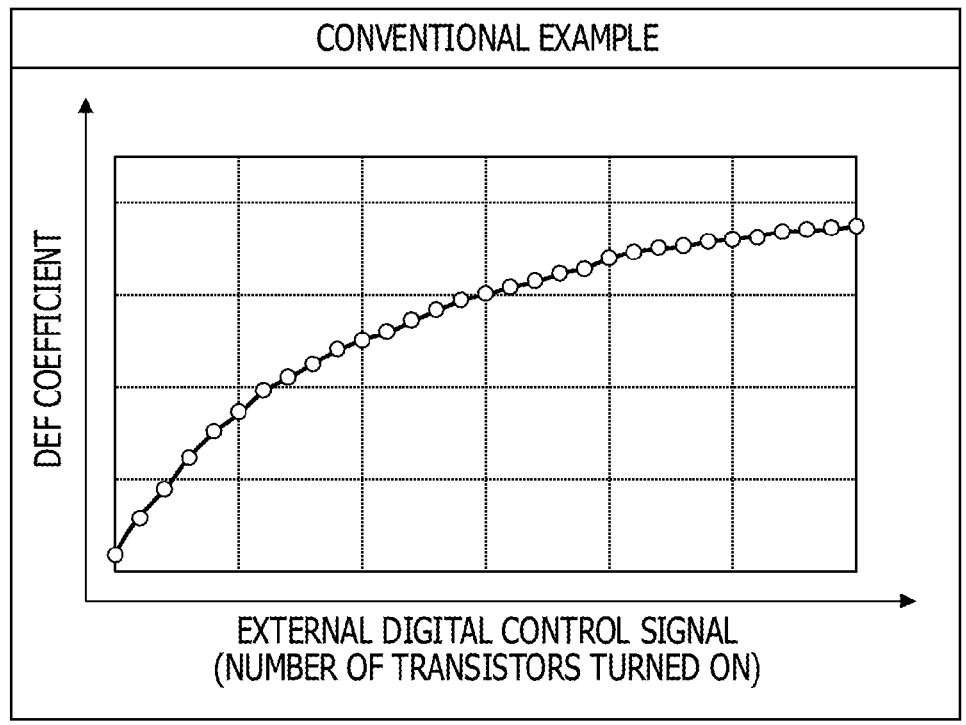
FIG. 7 is a diagram illustrating exemplary change of a DFE coefficient with an external control signal.
Figure 7:
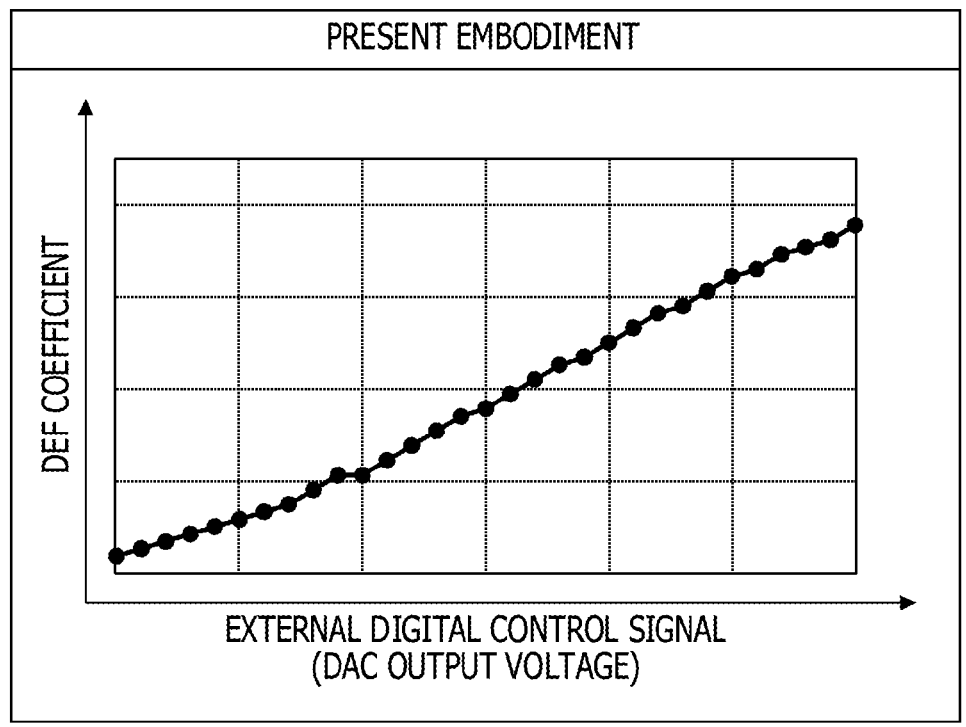

FIG. 7 is a diagram illustrating exemplary change of the DFE coefficient with the external control signal. In FIG. 7, "Conventional Example" indicates an exemplary of T. Shibasaki, et al., "A 56-Gb/s Receiver Front-End with a CTLE and 1-Tap DFE in 20-nm CMOS", IEEE Symp. VLSI Circuits, pp. 112-113, June 2014, and "Present Embodiment" indicates an example of the first embodiment.

In "Conventional Example", the DFE coefficient non-linearly changes with the external digital control signal (the number of transistors turned on). Thus, it is difficult to set the DFE coefficient to be equal to the value of the ISI where the resolution of the DFE coefficient is relatively large (when the digital control signal is relatively small). Accordingly, the DFE capability of removing the ISI decreases in some cases.

However, in "Present Embodiment", the linearity of the DFE coefficient with respect to the external digital control signal (output voltages of the DACs 50) improves as compared to "Conventional Example". In this manner, the linearity of the actually set DFE coefficient with respect to the external control signal that determines the DFE coefficient improves. As a result, the resolution of the DFE coefficient is large at no place. Accordingly, the ISI is further removed, and the ISI removing capability is improved.

Second Embodiment

Figure 8:
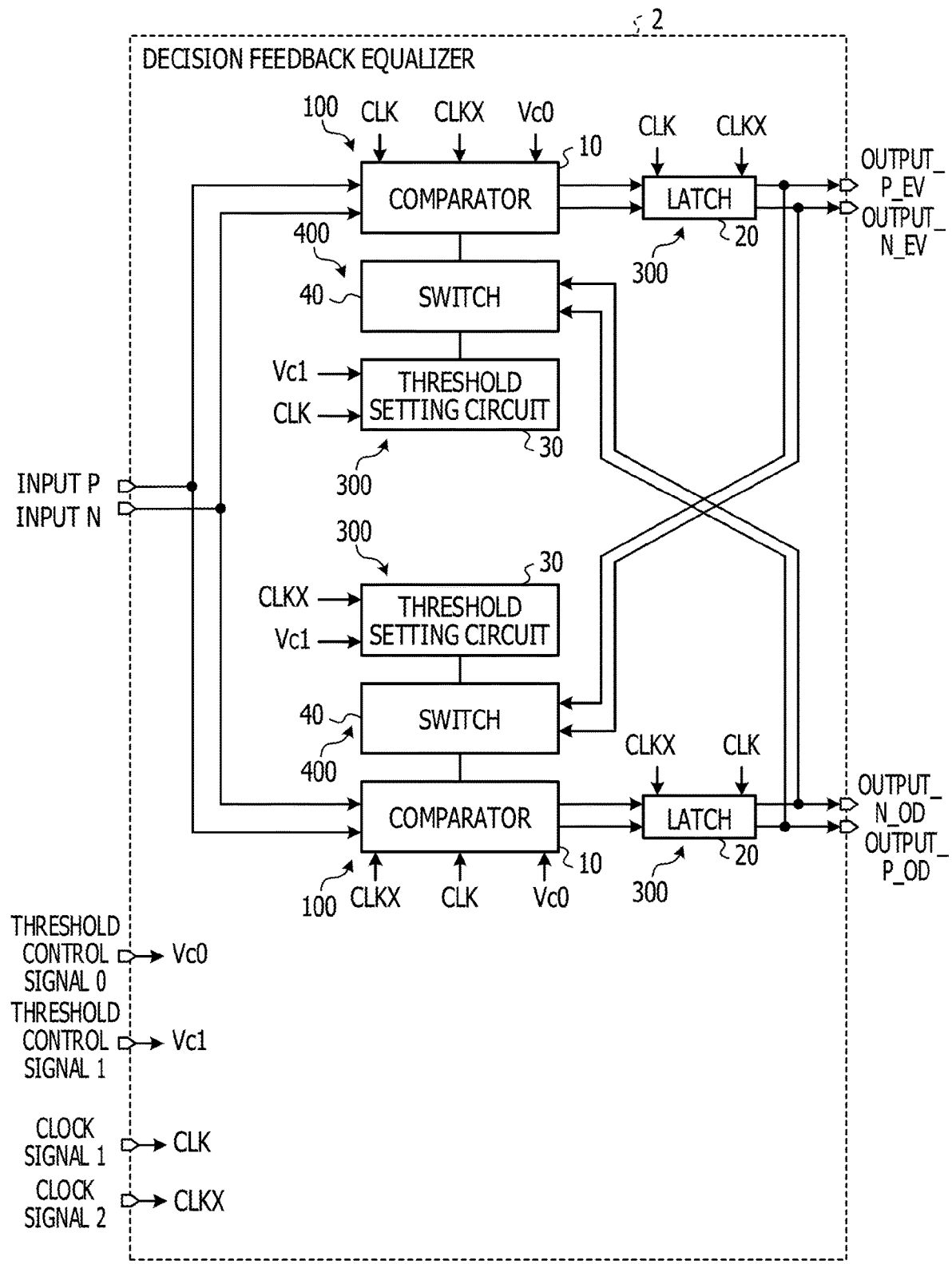
FIG. 8 is a diagram illustrating an exemplary configuration of a decision feedback equalizer according to a second embodiment.

FIG. 8 is a diagram illustrating an exemplary configuration of a decision feedback equalizer according to a second embodiment. Description of any configuration and effect of the second embodiment same as those of the above-described embodiments is omitted with reference to the above description.

An equalizer 2 illustrated in FIG. 8 is an exemplary decision feedback equalizer configured to reduce the influence of the ISI superimposed on differential data signals P and N input to the equalizer 2. A threshold control signal Vc0, a threshold control signal Vc1, a clock signal CLK, and a clock signal CLKX are supplied from the outside of the equalizer 2.

Figure 9:
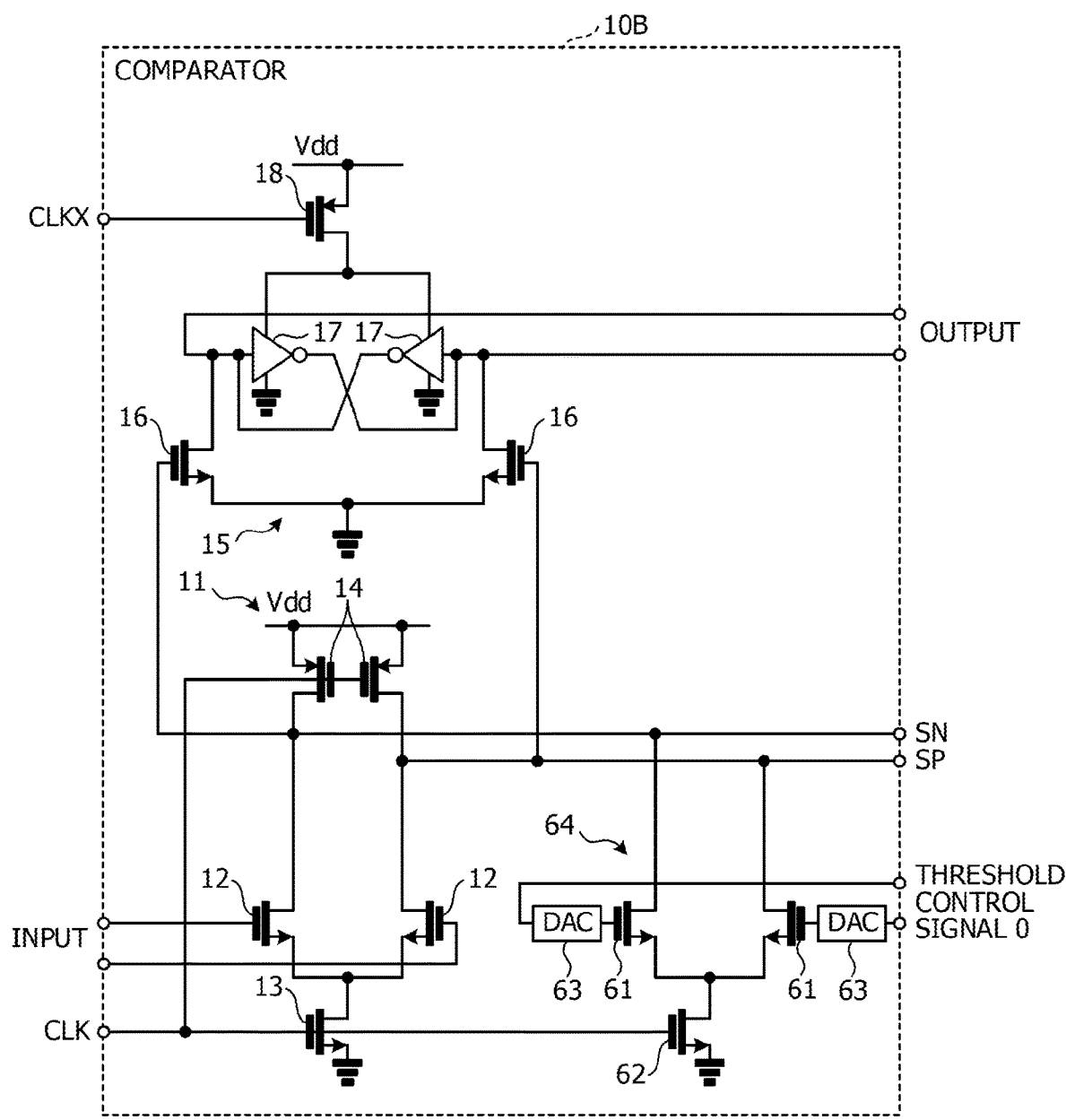
FIG. 9 is a diagram illustrating an exemplary configuration of a comparator according to the second embodiment.

FIG. 9 is a diagram illustrating an exemplary configuration of a comparator according to the second embodiment. This comparator 10B is an exemplary comparator 10.

In the even-side comparator 10e, the clock signal CLK and the clock signal CLKX are input as illustrated in FIG. 9. However, in the odd-side comparator 10o, the clock signal CLK illustrated in FIG. 9 is replaced with the clock signal CLKX, and the clock signal CLKX illustrated in FIG. 9 is replaced with the clock signal CLK.

The comparator 10B is different from the comparator 10A (refer to FIG. 3) in that the comparator 10B includes an offset adjustment circuit 64 connected in parallel with the input stage 11. The offset adjustment circuit 64 adjusts the offset of the decision threshold of the comparator 10B. The offset adjustment circuit 64 includes, for example, a transistor 62, a pair of threshold correction transistors 61, and a pair of DACs (digital-to-analog converters) 63.

The clock signal CLK is input to the transistor 62. The transistor 62 connects each of the pair of threshold correction transistors 61 and the ground.

The pair of threshold correction transistors 61 are connected in parallel with the input stage 11 of the comparator 10B. The pair of threshold correction transistors 61 are controlled through a pair of DACs 63 in accordance with the threshold control signal Vc0. One of the threshold correction transistors 61 is controlled through one of the DACs 63 in accordance with the threshold control signal Vc0. The one threshold correction transistor 61 is connected with a node SP between one of the transistors 14 and one of the transistors 12. The other threshold correction transistor 61 is controlled through the other DAC 63 in accordance with the threshold control signal Vc0. The other threshold correction transistor 61 is connected with a node SN between the other transistor 14 and the other transistor 12.

The pair of DACs 63 are exemplary digital-analog converters configured to control the pair of the threshold correction transistors 61 in accordance with the threshold control signal Vc0. The pair of DACs 63 convert the threshold control signal Vc0 that is digital into a threshold correction control voltage that is analog, and control the gates of the pair of the threshold correction transistors 61 by the converted threshold correction control voltage.

In FIG. 9, the transistors 61 and 62 are each, for example, an N-channel MOSFET.

The offset adjustment circuit 64 includes a DAC 63 configured to output a threshold correction control voltage having a voltage value that linearly changes with the threshold control signal Vc0 that is digital. The offset adjustment circuit 64 controls the gates of the transistors 61 connected in parallel with the input stage 11 by the threshold correction control voltages output from the respective DACs 60. Accordingly, correction can be performed to reduce the offset of the decision threshold of the comparator 10B due to individual variance at manufacturing.

Figure 10:
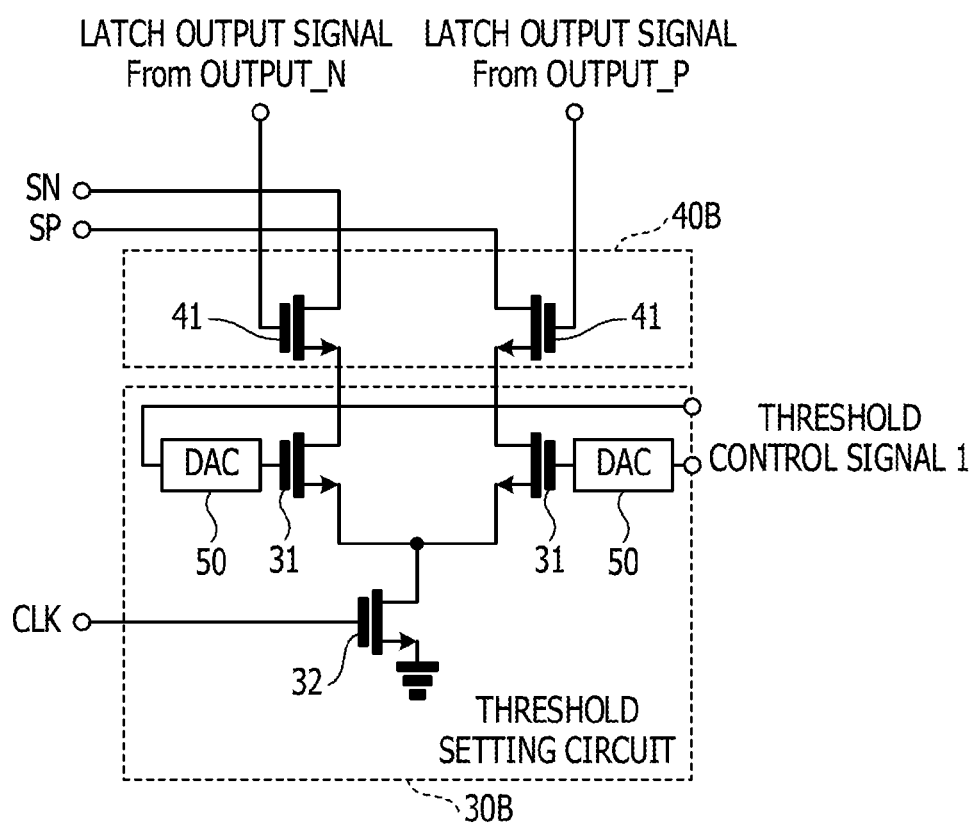
FIG. 10 is a diagram illustrating exemplary configurations of a switch unit and a threshold setting circuit according to the second embodiment.

FIG. 10 is a diagram illustrating exemplary configurations of a switch unit and a threshold setting circuit according to the second embodiment. This switch unit 40B is an exemplary switch unit 40, and this threshold setting circuit 30B is an exemplary threshold setting circuit 30.

In the even-side threshold setting circuit 30e, the clock signal CLK is input as illustrated in FIG. 10. However, in the odd-side threshold setting circuit 30o, the clock signal CLK illustrated in FIG. 10 is replaced with the clock signal CLKX.

The threshold setting circuit 30B includes the DACs 50 each configured to output a threshold control voltage having a voltage value that linearly changes with the threshold control signal Vc1 that is digital. The threshold setting circuit 30B controls the gate of each transistor 31 connected in parallel with the input stage 11 by the threshold control voltage output from the corresponding DAC 50. Accordingly, the DFE coefficient of the comparator 10B linearly changes with the threshold control signal Vc1 that is digital, and thus the decision threshold of the comparator 10B can be linearly changed. Accordingly, the ISI is further removed, and the ISI removing capability is improved.

Third Embodiment

Figure 11:
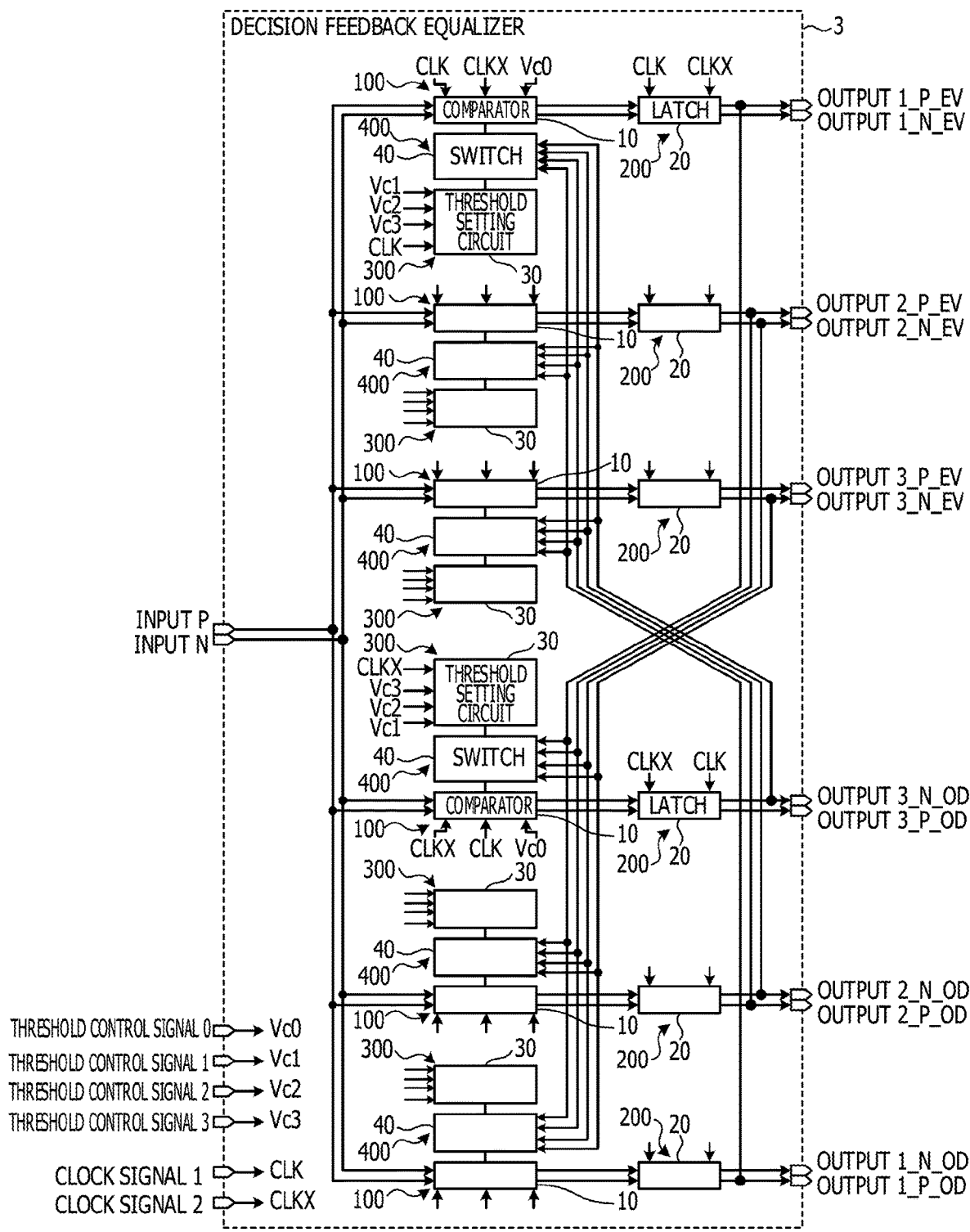
FIG. 11 is a diagram illustrating an exemplary configuration of a decision feedback equalizer according to a third embodiment.

FIG. 11 is a diagram illustrating an exemplary configuration of a decision feedback equalizer according to a third embodiment. Description of any configuration and effect of the third embodiment same as those of the above-described embodiments is omitted with reference to the above description.

An equalizer 3 illustrated in FIG. 11 is an exemplary decision feedback equalizer configured to reduce the influence of the ISI superimposed on differential data signals P and N input to the equalizer 3. Threshold control signals Vc0 to Vc3, a clock signal CLK, and a clock signal CLKX are supplied from the outside of the equalizer 3.

The equalizer 3 has a configuration for detecting the value of a four-valued pulse amplitude modulation (PAM) signal. Hereinafter, the four-valued pulse amplitude modulation signal is also referred to as a "PAM4 signal". The equalizer 3 includes the comparison circuit 100, the latch circuit 200, the switch circuit 400, and the setting circuit 300.

The comparison circuit 100 includes six comparators 10 configured to compare data signals P and N. The data signals P and N are PAM4 signals.

The latch circuit 200 includes six latches 20 each configured to latch a result of comparison by the corresponding one of the six comparators 10. The six latches 20 each latch a result of comparison by the comparator 10 connected with the latch 20 among the six comparators 10.

The switch circuit 400 includes the six switch units 40 each controlled to be turned on and off by output signals from the corresponding three latches 20 among the six latches 20. The three even-side switch units 40e are each controlled to be turned on and off by four latch output signals (output1_P_OD, output2_P_OD, output2_N_OD, and output3_N_OD) from the three odd-side latches 20o. The three odd-side switch units 40o are each controlled to be turned on and off by four latch output signals (output1_P_EV, output2_P_EV, output2_N_EV, and output3_N_EV) from the three even-side latches 20e.

The setting circuit 300 includes the six threshold setting circuits 30 each configured to set the decision threshold of the corresponding comparator 10 among the six comparators 10 in accordance with the threshold control signals Vc1 to Vc3 supplied from the outside of the equalizer 3. The threshold control signals Vc1 to Vc3 are exemplary control signals.

Figure 12:
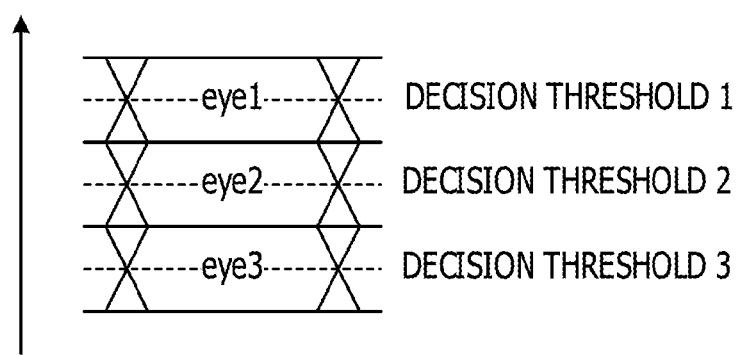
FIG. 12 is a diagram illustrating exemplary decision thresholds according to the third embodiment.

FIG. 12 is a diagram illustrating exemplary decision thresholds according to the third embodiment. As illustrated in FIG. 12, the decision threshold of each comparator 10 included in the equalizer 3 is set to be at a middle part of an eye formed by a PAM4 signal input to the comparator 10. For example, the decision threshold 1 of each of the first even-side comparator 10 and the first odd-side comparator 10 is set to eye 1. The decision threshold k of each of the k-th even-side comparator 10 and the k-th odd-side comparator 10 is set to eye k (k is a natural number of one to three).

Figure 13:
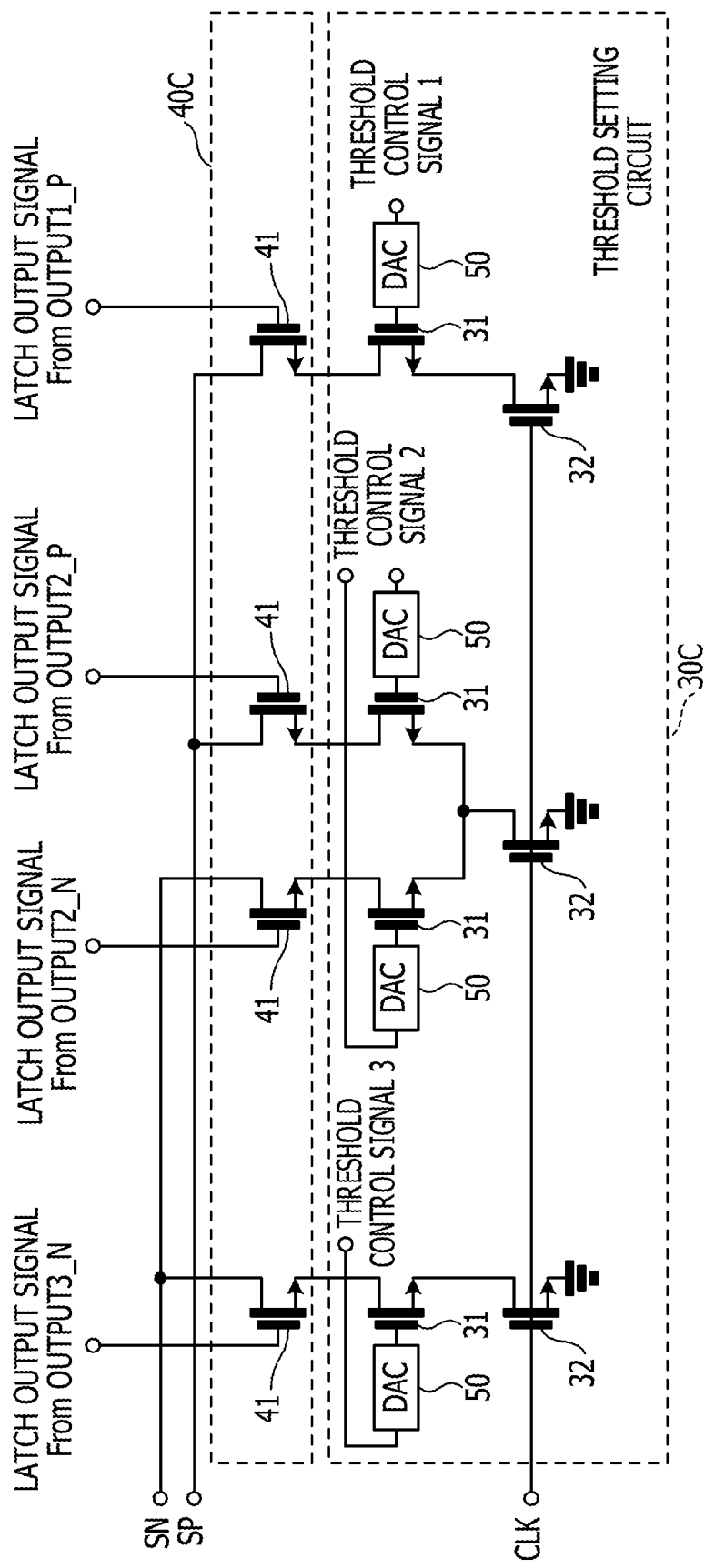
FIG. 13 is a diagram illustrating exemplary configurations of a switch unit and a threshold setting circuit according to the third embodiment.

FIG. 13 is a diagram illustrating exemplary configurations of a switch unit and a threshold setting circuit according to the third embodiment. This switch unit 40C is an exemplary switch unit 40, and this threshold setting circuit 30C is an exemplary threshold setting circuit 30. Each comparator 10 according to the third embodiment is, for example, the comparator 10A or the comparator 10B described above.

In the even-side comparator 10e, the clock signal CLK and the clock signal CLKX are input as illustrated in FIG. 3 or 9. However, in the odd-side comparator 10o, the clock signal CLK illustrated in FIG. 3 or 9 is replaced with the clock signal CLKX, and the clock signal CLKX illustrated in FIG. 3 or 9 is replaced with the clock signal CLK. In the even-side threshold setting circuit 30e, the clock signal CLK is input as illustrated in FIG. 13. However, in the odd-side threshold setting circuit 30o, the clock signal CLK illustrated in FIG. 13 is replaced with the clock signal CLKX.

In FIG. 13, the switch unit 40C includes the four transistors 41 connected in parallel with the input stage 11 of the comparator 10. The threshold setting circuit 30C includes the three transistors 32, the four threshold adjustment transistors 31, and the four DACs 50.

The threshold setting circuit 30C includes the DACs 50 each configured to output a threshold control voltage having a voltage value that linearly changes with the threshold control signals Vc1 to Vc3 that are digital. The threshold setting circuit 30C controls the gate of each transistor 31 connected in parallel with the input stage 11 by the threshold control voltage output from the corresponding DAC 50. Accordingly, the DFE coefficient of the comparator 10 linearly changes with the threshold control signals Vc1 to Vc3 that are digital, and thus the decision threshold of the comparator 10 can be linearly changed. Accordingly, the ISI is further removed, and the ISI removing capability is improved.

Figure 14:
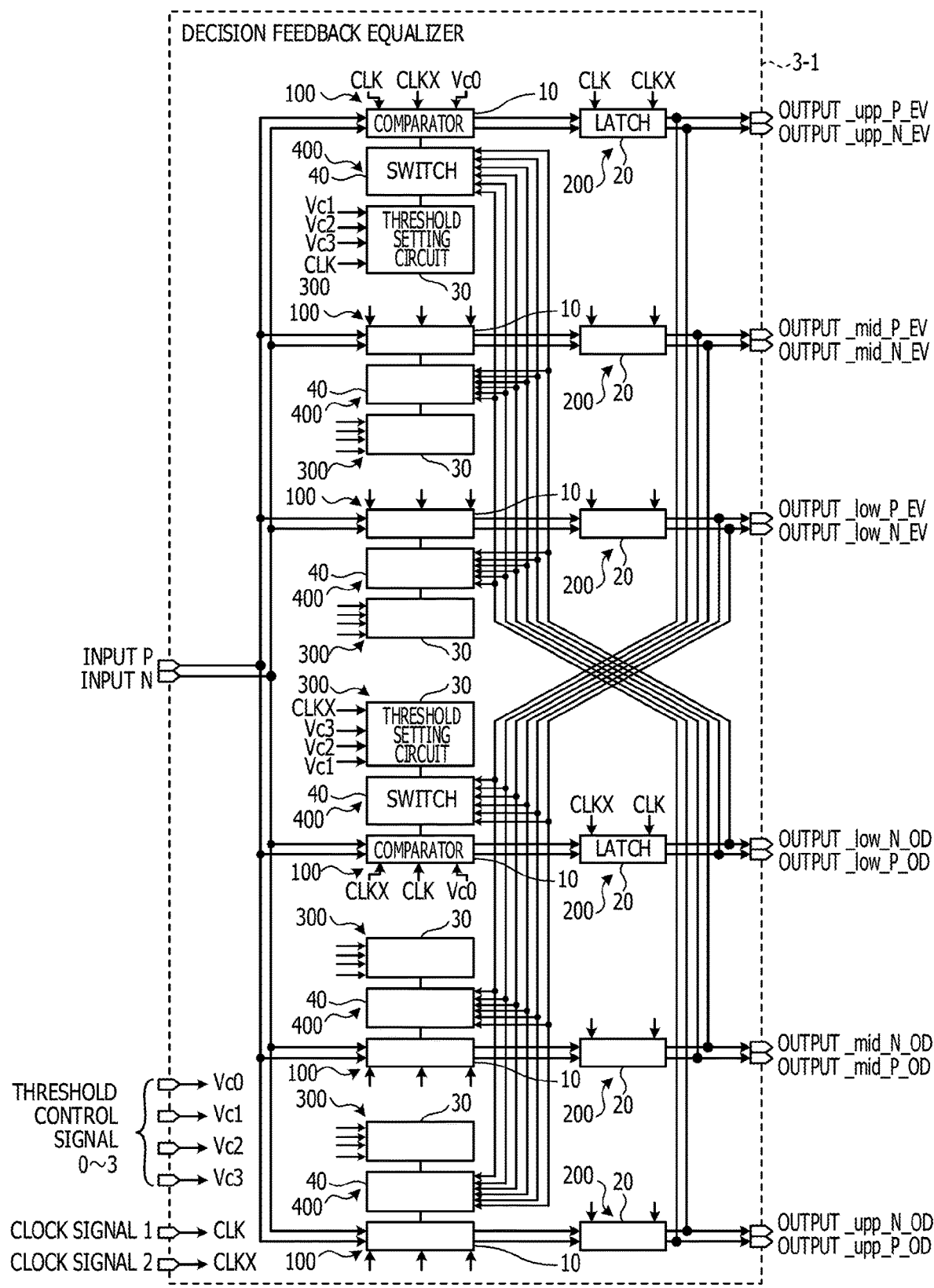
FIG. 14 is a diagram illustrating another exemplary configuration of the decision feedback equalizer according to the third embodiment.

FIG. 14 is a diagram illustrating another exemplary configuration of a decision feedback equalizer according to the third embodiment. This equalizer 3-1 illustrated in FIG. 14 is a modification of the equalizer 3 and has a configuration for detecting each PAM4 signal value.

The three even-side switch units 40e are each controlled to be turned on and off by six latch output signals (output_upp_P_OD, output_upp_N_OD, output_mid_P_OD, output_mid_N_OD, output_low_P_OD, and output_low_N_OD) of the three odd-side latches 20o. The three odd-side switch units 40o are each controlled to be turned on and off by six latch output signals (output_upp_P_EV, outputupp_N_EV, output_mid_P_EV, output_mid_N_EV, output_low_P_EV, output_low_N_EV) of the three even-side latches 20e.

Figure 15:
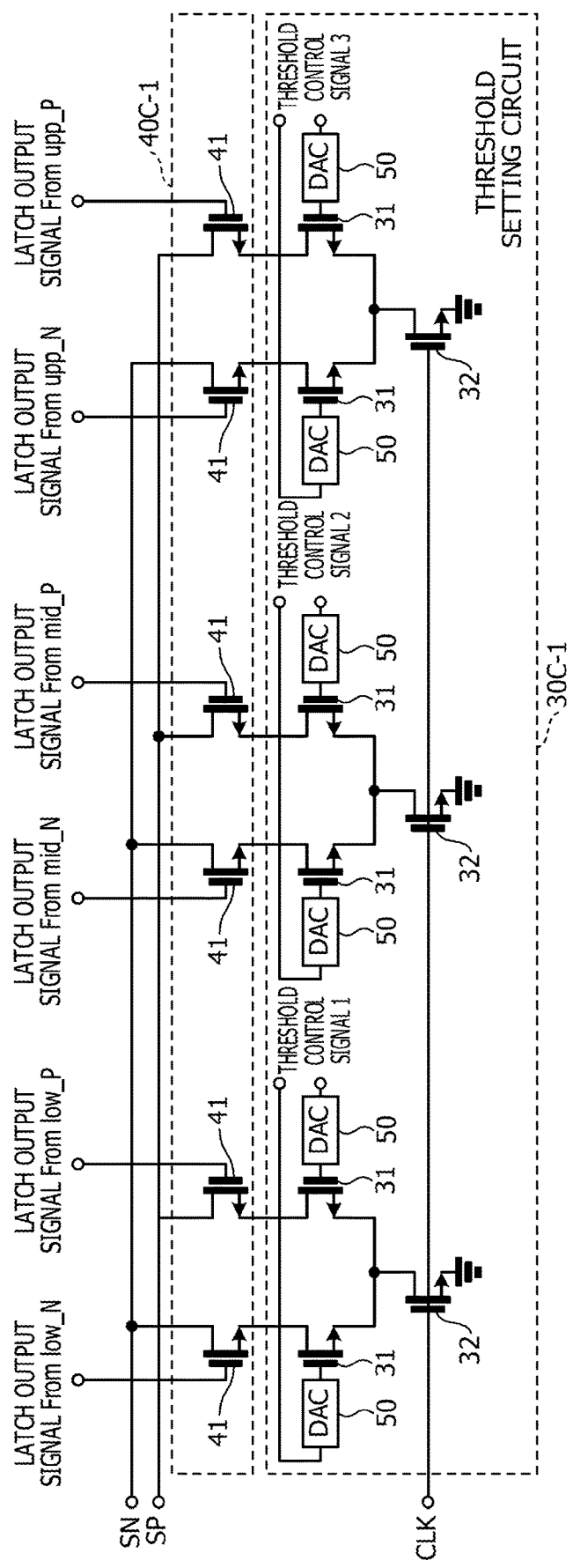
FIG. 15 is a diagram illustrating other exemplary configurations of the switch unit and the threshold setting circuit according to the third embodiment.

FIG. 15 is a diagram illustrating other exemplary configurations of the switch unit and the threshold setting circuit according to the third embodiment. This switch unit 40C-1 is an exemplary switch unit 40, and this threshold setting circuit 30C-1 is an exemplary threshold setting circuit 30.

In FIG. 15, the switch unit 40C-1 includes the six transistors 41 connected in parallel with the input stage 11 of the comparator 10. The threshold setting circuit 30C-1 includes the three transistors 32, the six threshold adjustment transistors 31, and the six DACs 50.

Fourth Embodiment

Figure 16:
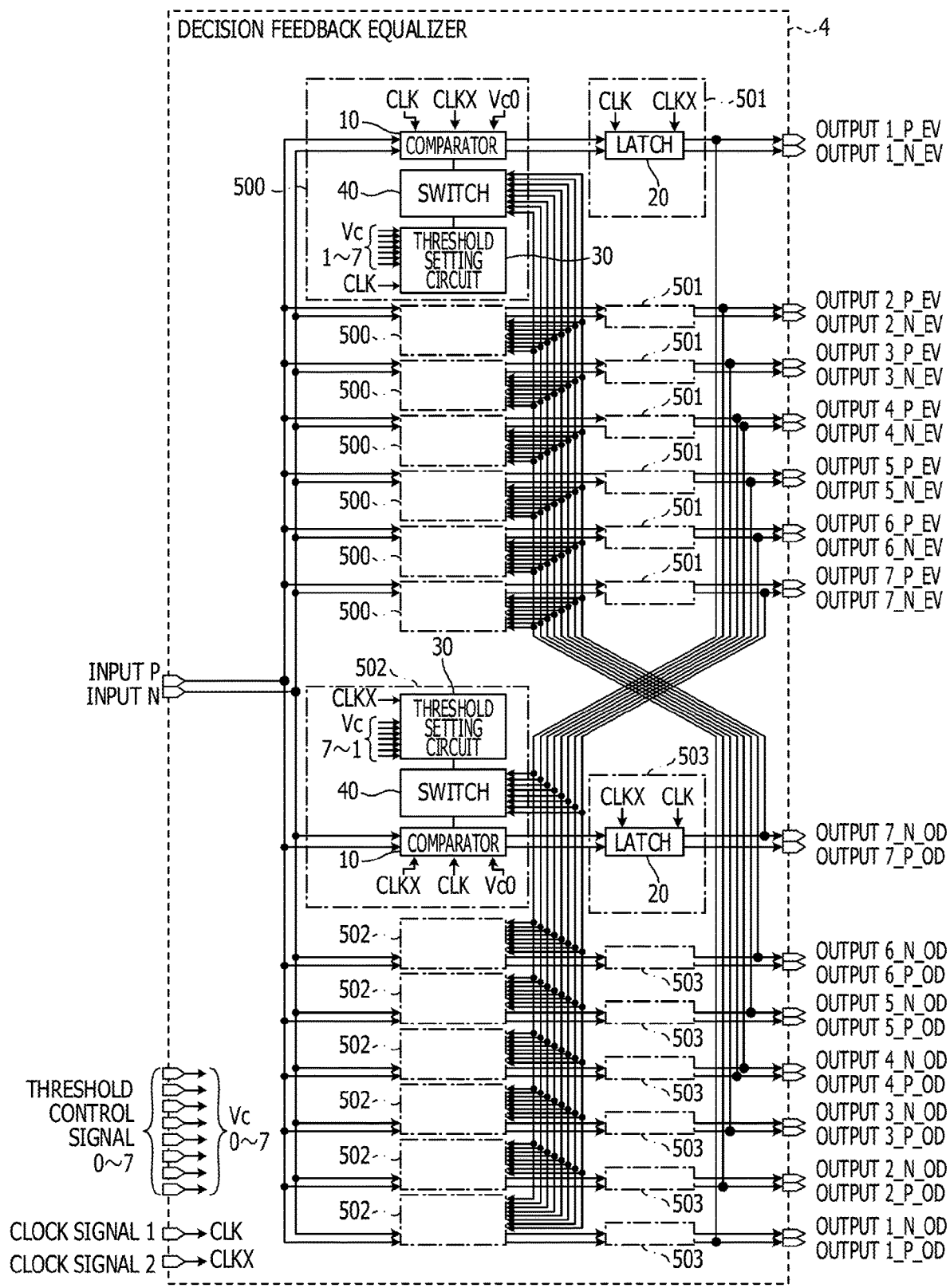
FIG. 16 is a diagram illustrating an exemplary configuration of a decision feedback equalizer according to a fourth embodiment.

FIG. 16 is a diagram illustrating an exemplary configuration of a decision feedback equalizer according to a fourth embodiment. Description of any configuration and effect of the fourth embodiment same as those of the above-described embodiments is omitted with reference to the above description.

This equalizer 4 illustrated in FIG. 16 is an exemplary decision feedback equalizer configured to reduce the influence of the ISI superimposed on differential data signals P and N input to the equalizer 4. Threshold control signals Vc0 to Vc7, a clock signal CLK, and a clock signal CLKX are supplied from the outside of the equalizer 4.

The equalizer 4 has a configuration for detecting the value of an eight-valued pulse amplitude modulation signal. Hereinafter, the eight-valued pulse amplitude modulation signal is also referred to as a "PAM8 signal". The equalizer 4 includes the comparison circuit 100, the latch circuit 200, the switch circuit 400, and the setting circuit 300 as described above. Circuits denoted by an identical reference sign among circuits 500 to 503 have configurations identical to each other.

The comparison circuit 100 includes the 14 comparators 10 each configured to compare the data signals P and N. The data signals P and N are each the PAM8 signal.

The latch circuit 200 includes the 14 latches 20 each configured to latch a result of comparison by the corresponding one of the 14 comparators 10. The 14 latches 20 each latch a result of comparison by the comparator 10 connected with the latch 20 among the 14 comparators 10.

The switch circuit 400 includes the 14 switch units 40 each controlled to be turned on and off by output signals from the corresponding seven latches 20 among the 14 latches 20. The seven even-side switch units 40e are each controlled to be turned on and off by eight latch output signals (output1_P_OD, output2_P_OD, output3_P_OD, output4_P_OD, output4_N_OD output5_N_OD, output6_N_OD, and output7_N_OD) from the seven odd-side latches 200. The seven odd-side switch units 40o are each controlled to be turned on and off by eight latch output signals (output1_P_EV, output2_P_EV, output3_P_EV, output4_P_EV, output4_N_EV, output5_N_EV, output6_N_EV, and output7_N_EV) from the seven even-side latches 20e.

The setting circuit 300 includes the 14 threshold setting circuits 30 each configured to set the decision threshold of the comparator 10 of the corresponding one of the 14 comparators 10 in accordance with the threshold control signals Vc1 to Vc7 supplied from the outside of the equalizer 4. The threshold control signals Vc1 to Vc7 are exemplary control signals.

Figure 17:
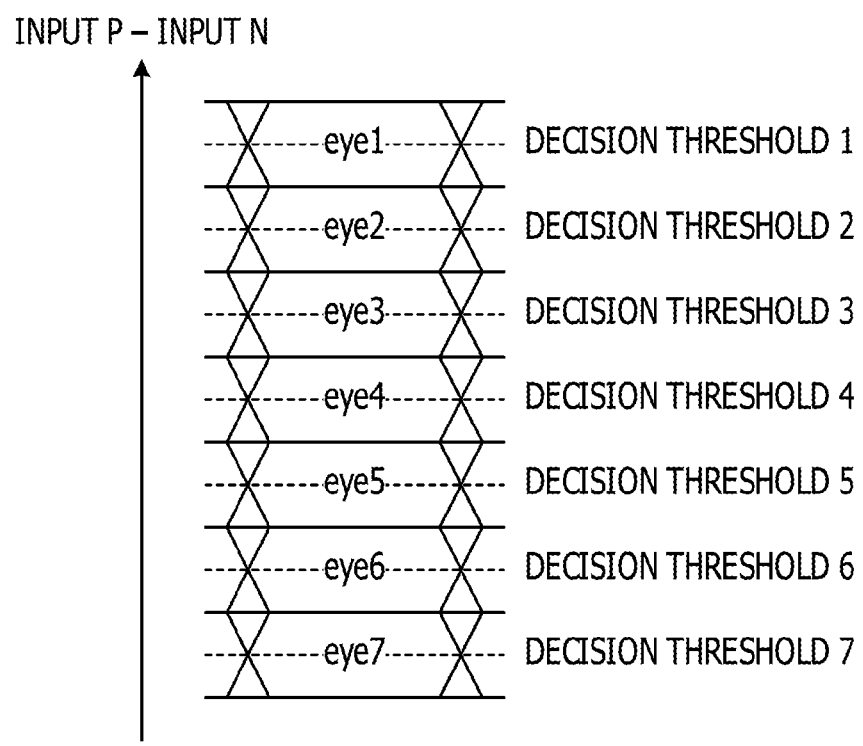
FIG. 17 is a diagram illustrating exemplary decision thresholds according to the fourth embodiment.

FIG. 17 is a diagram illustrating exemplary decision thresholds according to the fourth embodiment. As illustrated in FIG. 17, the decision threshold of each comparator 10 included in the equalizer 4 is set to be at a middle part of an eye formed by the PAM8 signal input to the comparator 10. For example, the decision threshold 1 of each of the first even-side comparator 10 and the first odd-side comparator 10 is set to eye 1. The decision threshold k of each of the k-th even-side comparator 10 and the k-th odd-side comparator 10 is set to eye k (k is a natural number of one to seven).

Figure 18:
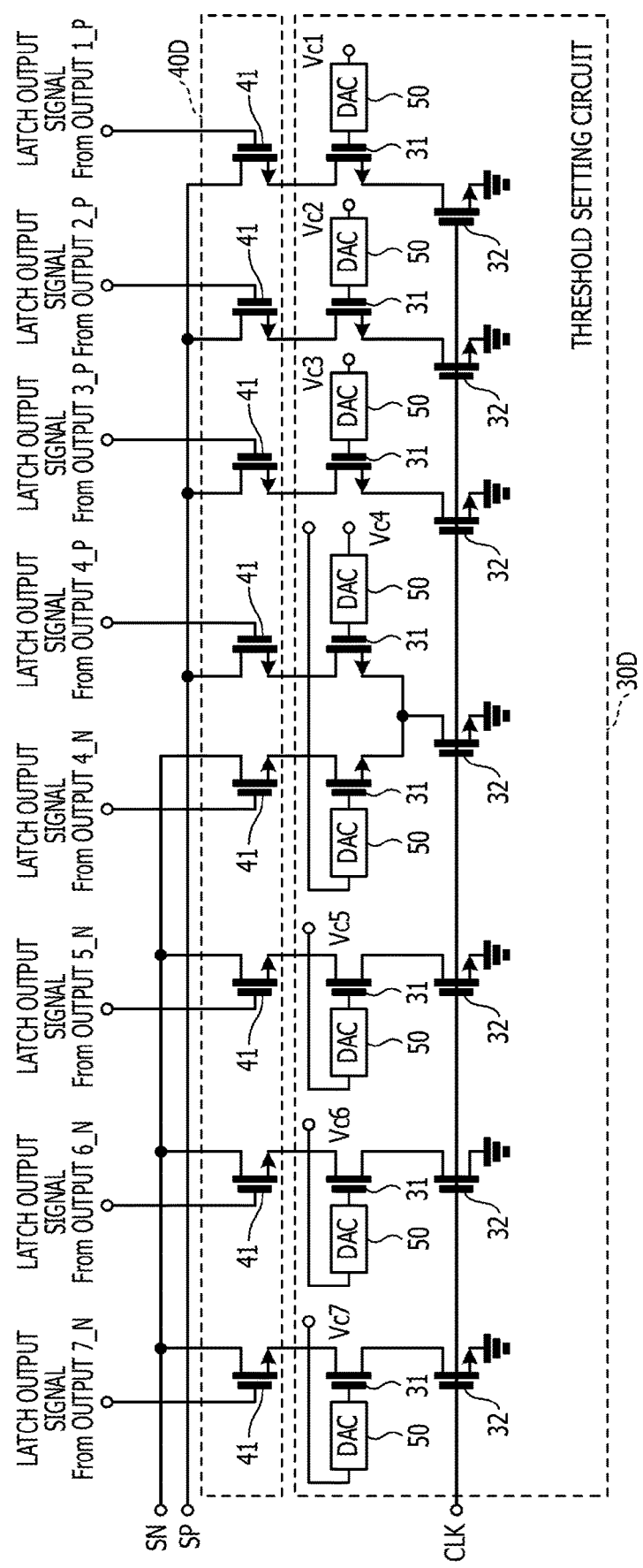
FIG. 18 is a diagram illustrating exemplary configurations of a switch unit and a threshold setting circuit according to the fourth embodiment.

FIG. 18 is a diagram illustrating exemplary configurations of a switch unit and a threshold setting circuit according to the fourth embodiment. This switch unit 40D is an exemplary switch unit 40, and this threshold setting circuit 30D is an exemplary threshold setting circuit 30. Each comparator 10 according to the fourth embodiment is, for example, the comparator 10A or the comparator 10B described above.

In the even-side comparator 10e, the clock signal CLK and the clock signal CLKX are input as illustrated in FIG. 3 or 9. However, in the odd-side comparator 10o, the clock signal CLK illustrated in FIG. 3 or 9 is replaced with the clock signal CLKX, and the clock signal CLKX illustrated in FIG. 3 or 9 is replaced with the clock signal CLK. In the even-side threshold setting circuit 30e, the clock signal CLK is input as illustrated in FIG. 18. However, in the odd-side threshold setting circuit 30o, the clock signal CLK illustrated in FIG. 18 is replaced with the clock signal CLKX.

In FIG. 18, the switch unit 40D includes the eight transistors 41 connected in parallel with the input stage 11 of the comparator 10. The threshold setting circuit 30D includes the seven transistors 32, the eight threshold adjustment transistors 31, and the eight DACs 50.

The threshold setting circuit 30D includes the DACs 50 each configured to output a threshold control voltage having a voltage value that linearly changes with the threshold control signals Vc1 to Vc7 that are digital. The threshold setting circuit 30D controls the gate of each transistor 31 connected in parallel with the input stage 11 by the threshold control voltage output from the corresponding DAC 50. Accordingly, the DFE coefficient of the comparator 10 linearly changes with the threshold control signals Vc1 to Vc7 that are digital, and thus the decision threshold of the comparator 10 can be linearly changed. Accordingly, the ISI is further removed, and the ISI removing capability is improved.

Fifth Embodiment

Figure 19:
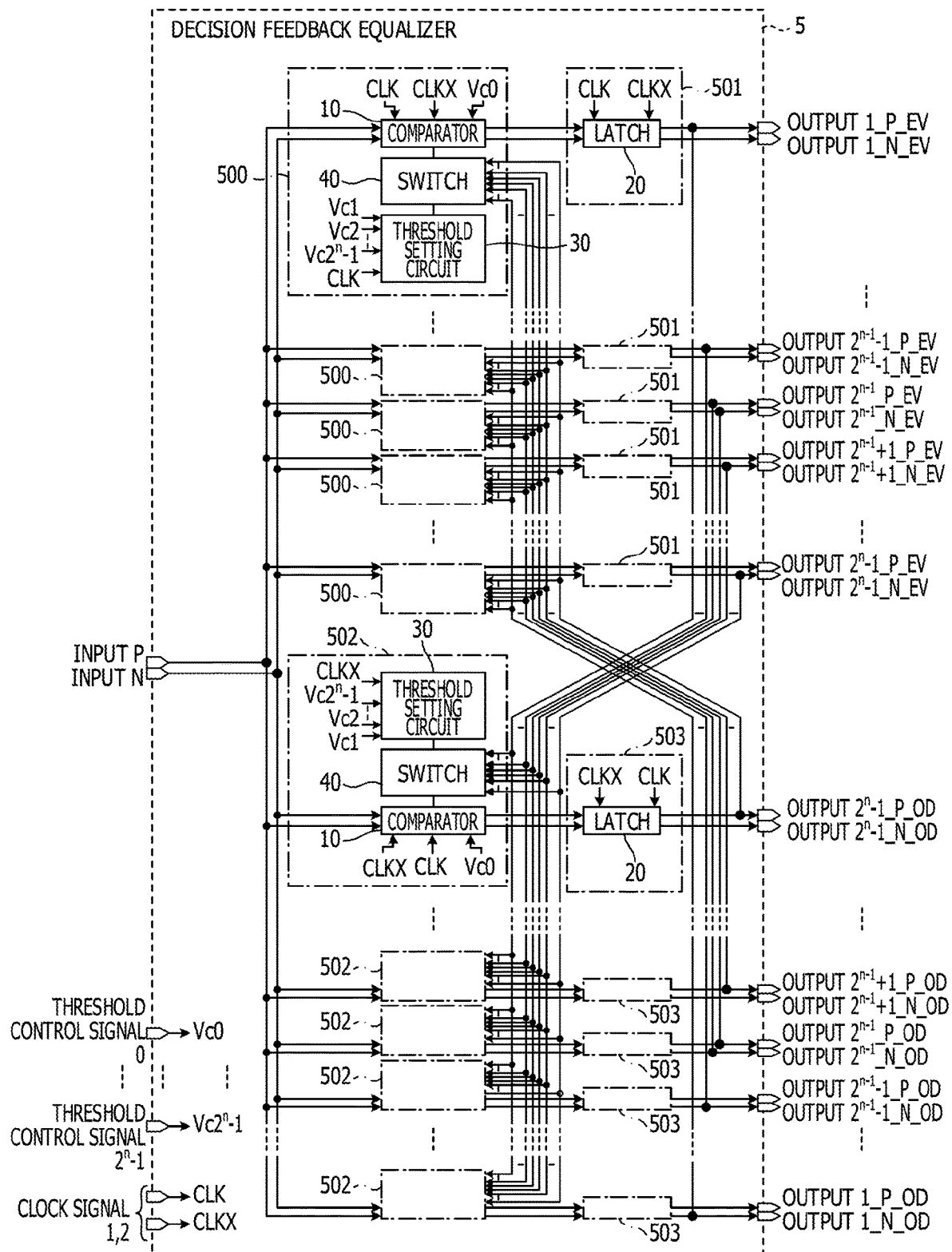
FIG. 19 is a diagram illustrating an exemplary configuration of a decision feedback equalizer according to a fifth embodiment.

FIG. 19 is a diagram illustrating an exemplary configuration of a decision feedback equalizer according to a fifth embodiment. Description of any configuration and effect of the fifth embodiment same as those of the above-described embodiments is omitted with reference to the above description.

The fifth embodiment is generalization of the third and fourth embodiments. This equalizer 5 illustrated in FIG. 19 has a configuration for detecting the value of a $2^n$-valued (n is a natural number) pulse amplitude modulation signal. Hereinafter, the $2^n$-valued pulse amplitude modulation signal is also referred to as a "PAM$2^n$" signal".

The comparison circuit 100 includes the $2\times(2^n-1)$ comparators 10 each configured to compare PAM$2^n$ signals. The latch circuit 200 includes, for the respective $2\times(2^n-1)$ comparators 10, the latches 20 configured to latch results of comparison by the $2\times(2^n-1)$ comparators 10. The switch circuit 400 includes, for the respective $2\times(2^n-1)$ latches 20, the switch units 40 controlled to be turned on and off by output signals from the $2\times(2^n-1)$ latches 20. The setting circuit 300 includes, for the respective $2\times(2^n-1)$ comparators 10, threshold setting circuits configured to set the decision thresholds of the $2\times(2^n-1)$ comparators 10 in accordance with threshold control signals Vc1 to Vc($2^n-1$) supplied from the outside of the equalizer 5. The threshold control signals Vc1 to Vc($2^n-1$) are exemplary control signals.

Figure 20:
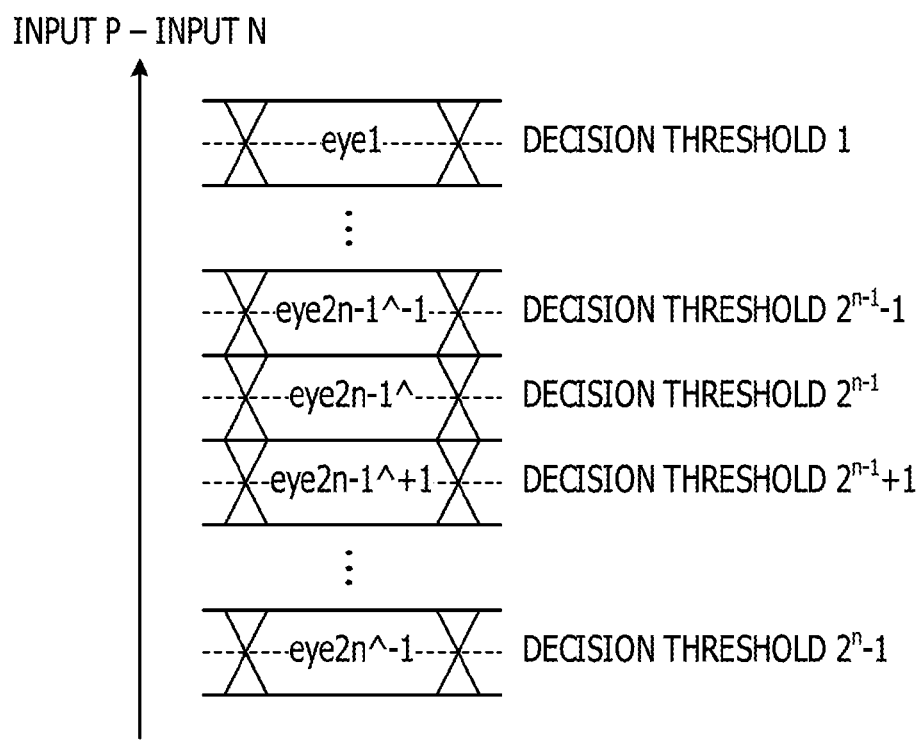
FIG. 20 is a diagram illustrating exemplary decision thresholds according to the fifth embodiment.

FIG. 20 is a diagram illustrating exemplary decision thresholds according to the fifth embodiment. The decision threshold of each comparator 10 included in the equalizer 5 is set to be at a middle part of each eye formed by the PAM$2^n$ signals input to the comparator 10 as illustrated in FIG. 20. For example, the decision threshold 1 of each of the first even-side comparator 10 and the first odd-side comparator 10 is set to eye 1. The decision threshold k of each of the k-th even-side comparator 10 and the k-th odd-side comparator 10 is set to eye k (k is a natural number of one to $2^n-1$).

Figure 21:
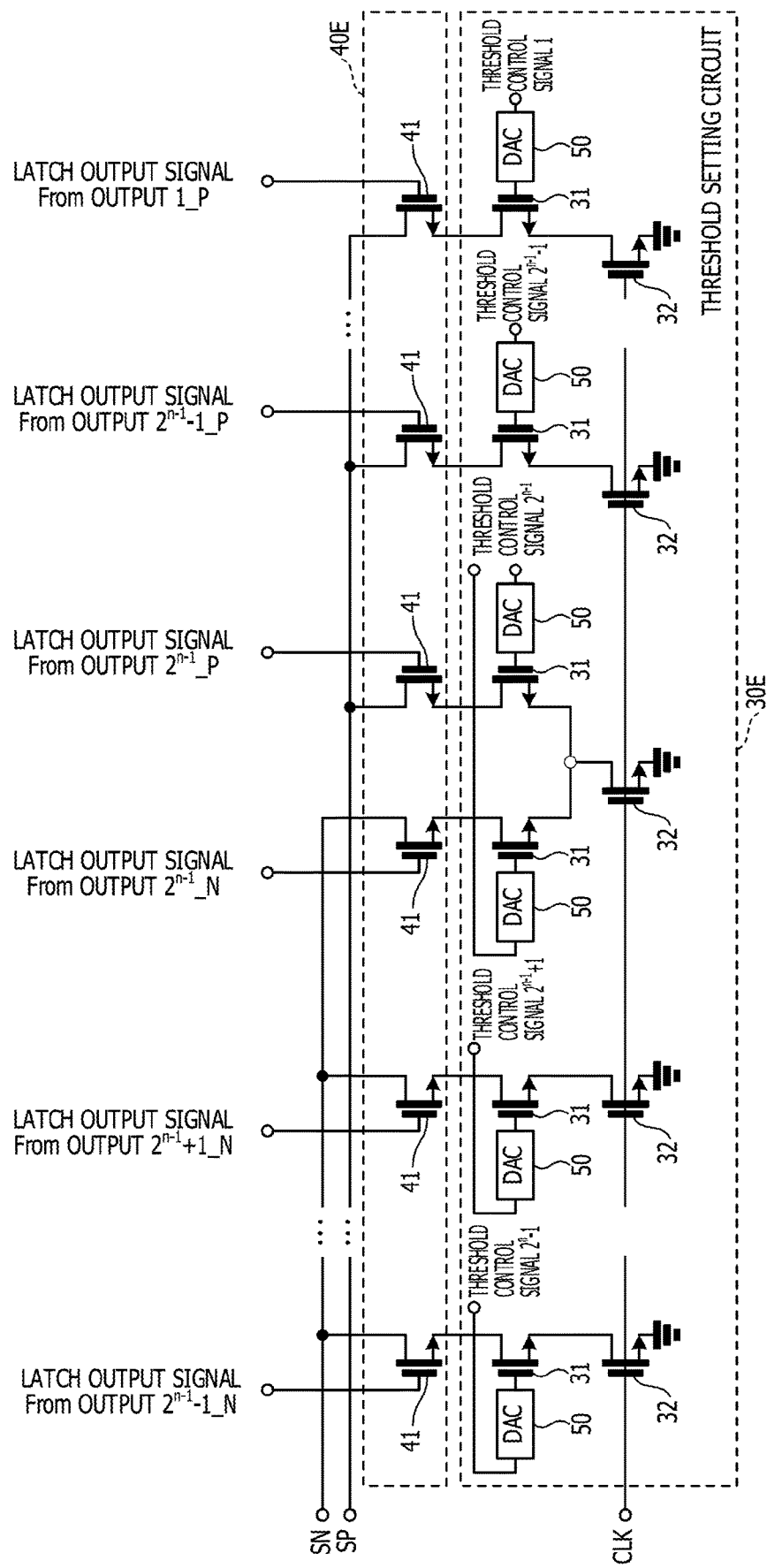
FIG. 21 is a diagram illustrating exemplary configurations of a switch unit and a threshold setting circuit according to the fifth embodiment.

FIG. 21 is a diagram illustrating exemplary configurations of a switch unit and a threshold setting circuit according to the fifth embodiment. This switch unit 40E is an exemplary switch unit 40, and this threshold setting circuit 30E is an exemplary threshold setting circuit 30. Each comparator 10 according to the fifth embodiment is, for example, the comparator 10A or the comparator 10B described above.

In the even-side comparator 10e, the clock signal CLK and the clock signal CLKX are input as illustrated in FIG. 3 or 9. However, in the odd-side comparator 10o, the clock signal CLK illustrated in FIG. 3 or 9 is replaced with the clock signal CLKX, and the clock signal CLKX illustrated in FIG. 3 or 9 is replaced with the clock signal CLK. In the even-side threshold setting circuit 30e, the clock signal CLK is input as illustrated in FIG. 21. However, in the odd-side threshold setting circuit 30o, the clock signal CLK illustrated in FIG. 21 is replaced with the clock signal CLKX.

In FIG. 21, the switch unit 40E includes the $2^n$ transistors 41 connected in parallel with the input stage 11 of the comparator 10. The threshold setting circuit 30E includes the ($2^n-1$) transistors 32, the $2^n$ threshold adjustment transistors 31, and the $2^n$ DACs 50.

The threshold setting circuit 30E includes the DACs 50 each configured to output a threshold control voltage having a voltage value that linearly changes with the threshold control signals Vc1 to Vc($2^n-1$) that are digital. The threshold setting circuit 30E controls the gate of each transistor 31 connected in parallel with the input stage 11 by the threshold control voltage output from the corresponding DAC 50. Accordingly, the DFE coefficient of the comparator 10 linearly changes with the threshold control signals Vc1 to Vc($2^n-1$) that are digital, and thus the decision threshold of the comparator 10 can be linearly changed. Accordingly, the ISI is further removed, and the ISI removing capability is improved.

Sixth Embodiment

Figure 22:
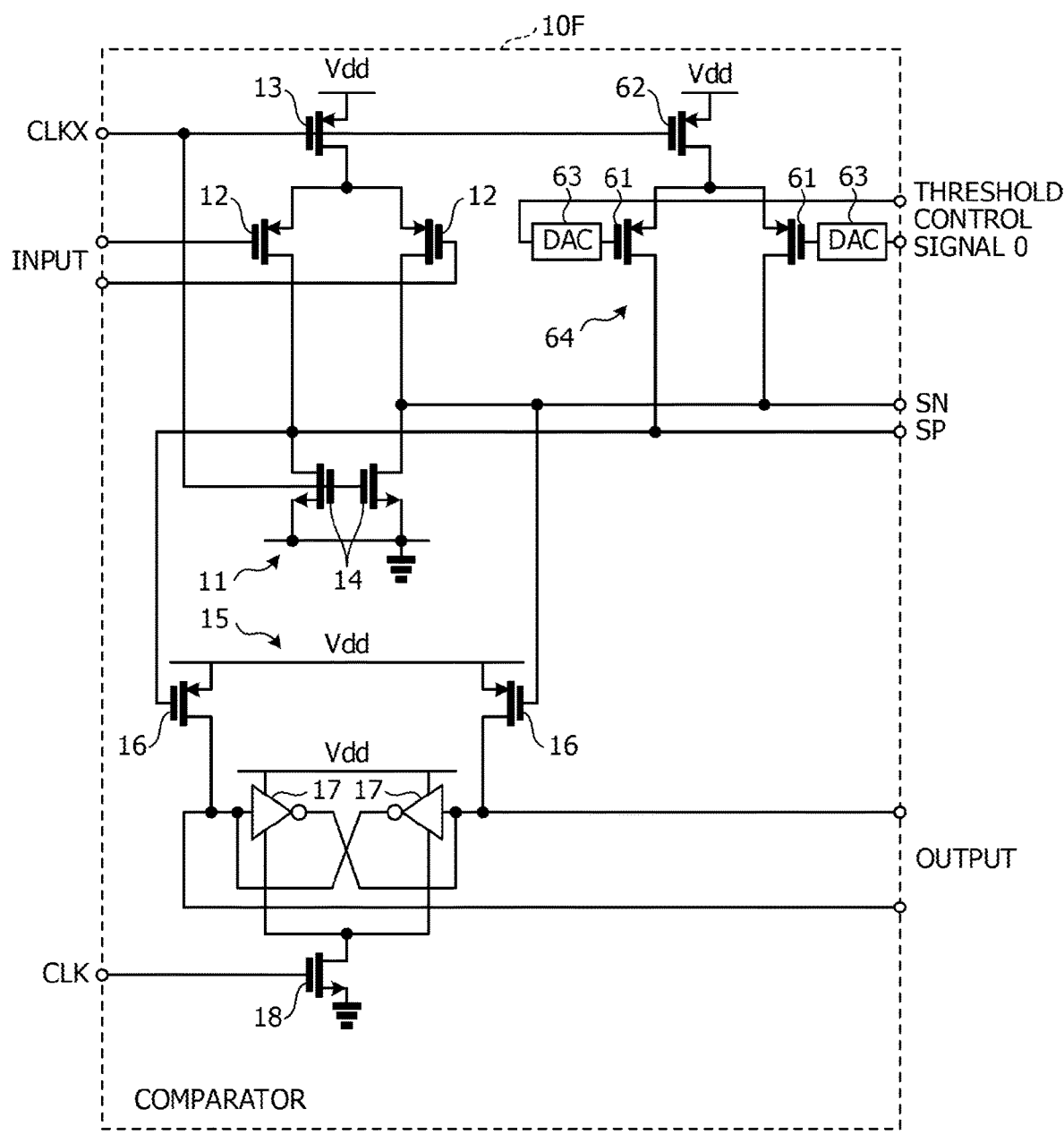
FIG. 22 is a diagram illustrating an exemplary configuration of a comparator according to a sixth embodiment.

FIG. 22 is a diagram illustrating an exemplary configuration of a comparator according to a sixth embodiment. Description of any configuration and effect of the sixth embodiment same as those of the above-described embodiments is omitted with reference to the above description.

In the first to fifth embodiments, the input stage 11 of each comparator 10 includes the pair of transistors 12 as an N-channel differential pair. However, in the sixth embodiment, the input stage 11 of a comparator 1OF includes the pair of transistors 12 as a P-channel differential pair. The input stage 11 compares data signals P and N through the P-channel differential pair, and thus each comparator 10 can operate when the operating point of the input data signals P and N decreases.

In FIG. 22, the transistors 12, 13, 16, 61, and 62 are each a P-channel MOSFET. The transistors 14 and 18 are each an N-channel MOSFET.

Figure 23:
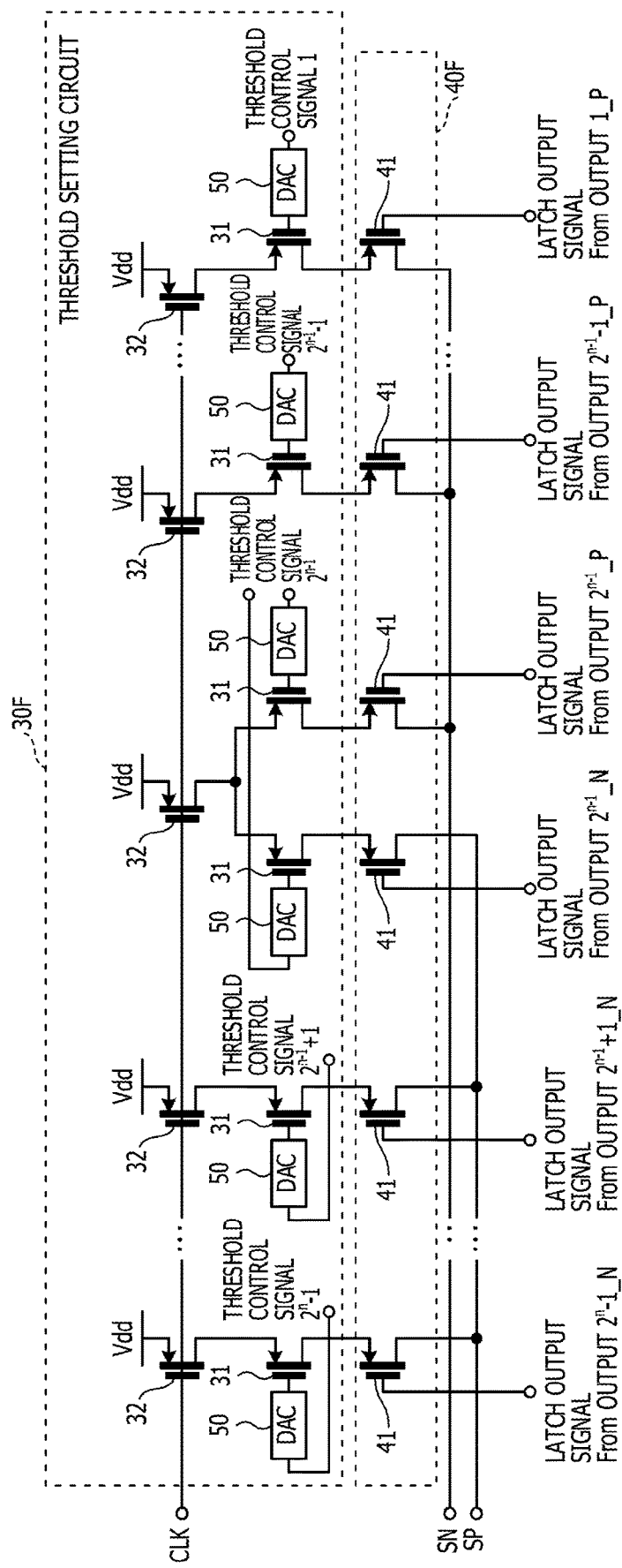
FIG. 23 is a diagram illustrating exemplary configurations of a switch unit and a threshold setting circuit according to the sixth embodiment.

FIG. 23 is a diagram illustrating exemplary configurations of a switch unit and a threshold setting circuit according to the sixth embodiment. In the sixth embodiment, since the input stage 11 of the comparator 1OF compares the data signals P and N through the P-channel differential pair, the transistors 31 and 32 of a threshold setting circuit 30F and the transistors 41 of a switch unit 40F are of the P-channel type as illustrated in FIG. 23.

Seventh Embodiment

Figure 24:
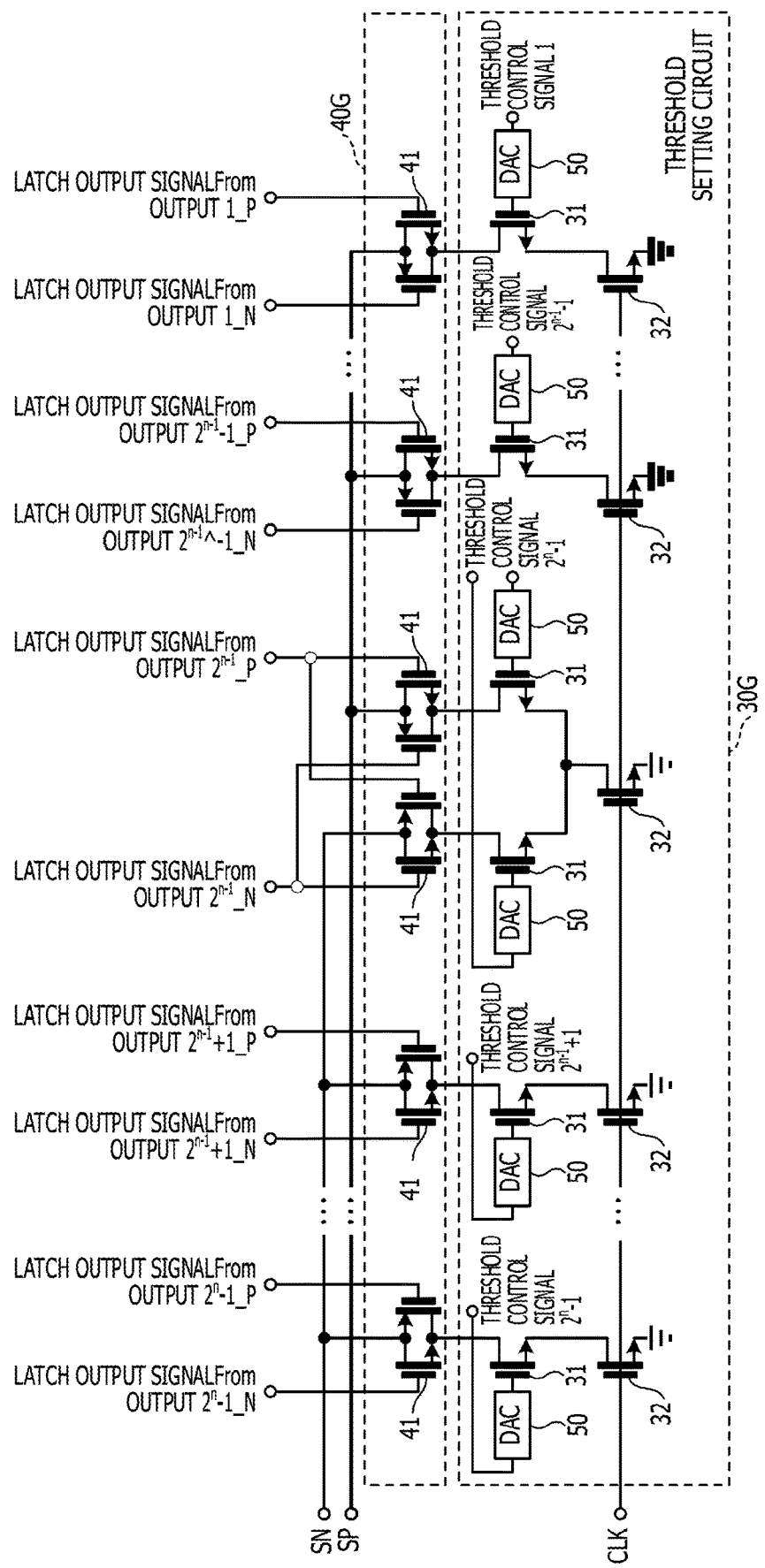
FIG. 24 is a diagram illustrating exemplary configurations of a switch unit and a threshold setting circuit according to a seventh embodiment.

FIG. 24 is a diagram illustrating exemplary configurations of a switch unit and a threshold setting circuit according to a seventh embodiment. Description of any configuration and effect of the seventh embodiment same as those of the above-described embodiments is omitted with reference to the above description.

In the seventh embodiment, each transistor 41 connecting the comparator 10 and a threshold setting circuit 30G is a complementary switch as a combination of a P-channel transistor and an N-channel transistor. Accordingly, each transistor 41 connecting the comparator 10 and the threshold setting circuit 30G can be reliably turned on and off when the nodes SN and SP and the drain voltage of each transistor 31 of the threshold setting circuit 30G are each at a middle potential.

Eighth Embodiment

Figure 25:
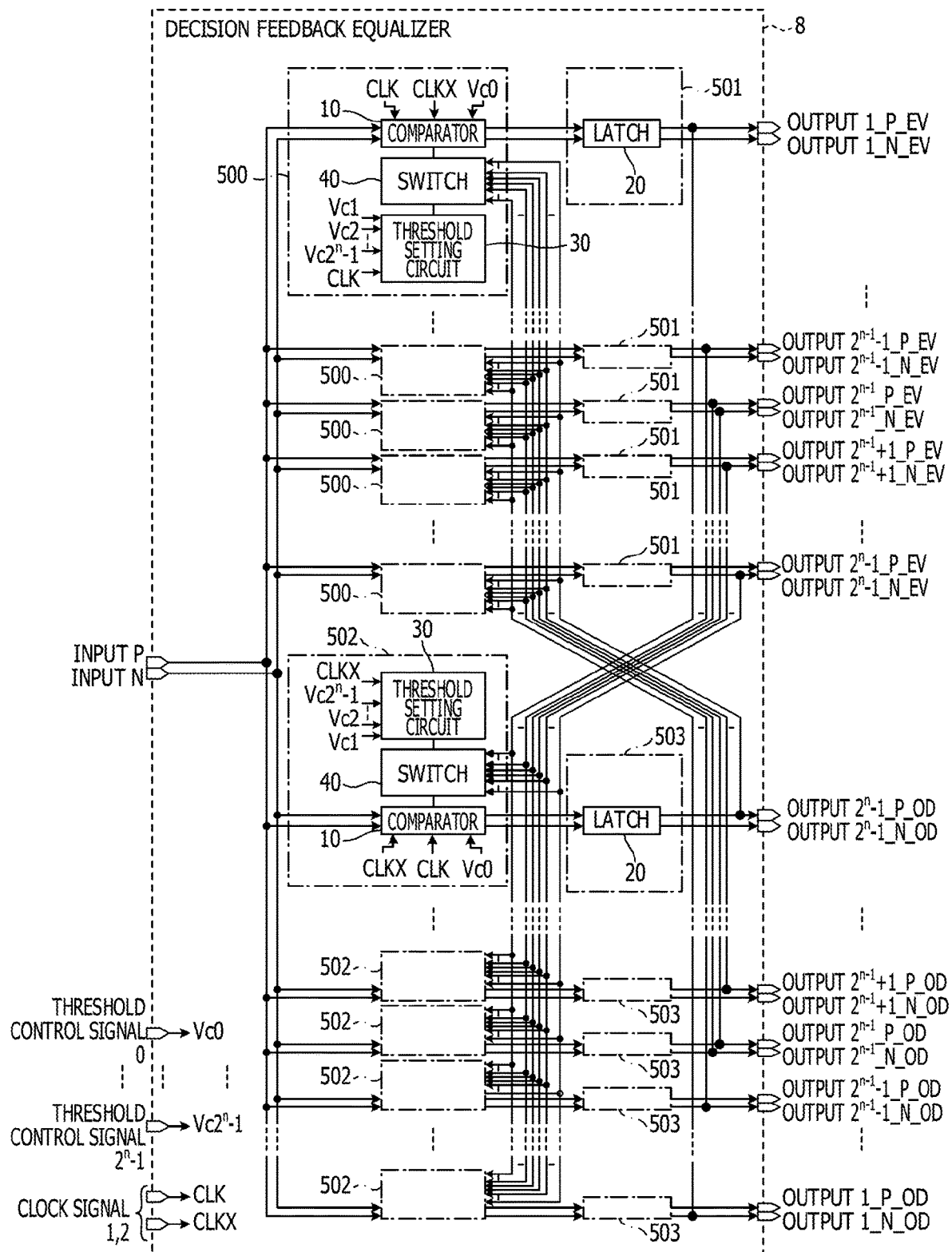
FIG. 25 is a diagram illustrating an exemplary configuration of a decision feedback equalizer according to an eighth embodiment.

FIG. 25 is a diagram illustrating an exemplary configuration of a decision feedback equalizer according to an eighth embodiment. Description of any configuration and effect of the eighth embodiment same as those of the above-described embodiments is omitted with reference to the above description.

In the eighth embodiment, each latch 20 includes a component (for example, an RS latch circuit) configured not to be controlled by the external clock signals CLK and CLKX. With this configuration, no clock signal is applied to the latch circuit, and thus the size of a circuit through which the clock signal is distributed can be reduced accordingly.

Ninth Embodiment

Figure 26:
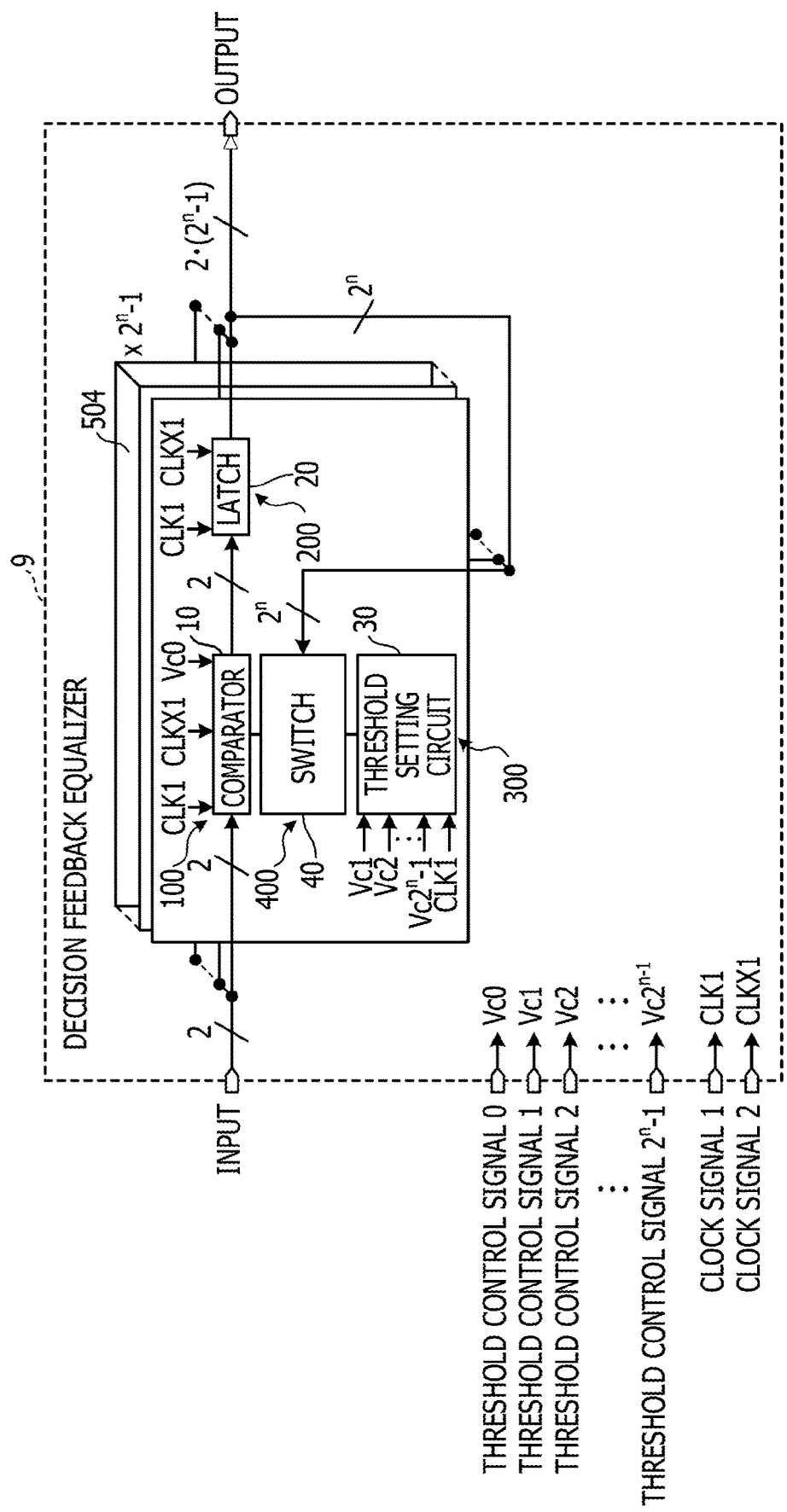
FIG. 26 is a diagram illustrating an exemplary configuration of a decision feedback equalizer according to a ninth embodiment.

FIG. 26 is a diagram illustrating an exemplary configuration of a decision feedback equalizer according to a ninth embodiment. Description of any configuration and effect of the ninth embodiment same as those of the above-described embodiments is omitted with reference to the above description.

In the first to eighth embodiments, each equalizer is a half-rate DFE having a two-parallel time interleaved configuration and configured to perform time interleaved operation. However, in the ninth embodiment, this equalizer 9 is a full-rate DFE not having the time interleaved configuration. With no time interleaved configuration, the circuit size of the equalizer 9 can be reduced.

The equalizer 9 has a configuration for detecting the value of a $2^n$-valued (n is a natural number) pulse amplitude modulation signal (PAM$2^n$ signal). The equalizer 9 includes $(2^n-1)$ equalization circuit units 504 to detect the values of the PAM$2^n$ signal. The equalizer 9 includes the comparison circuit 100, the latch circuit 200, the switch circuit 400, and the setting circuit 300.

The $(2^n-1)$ equalization circuit units 504 each include one comparator 10, and the comparison circuit 100 includes the $(2^n-1)$ comparators 10 in the $(2^n-1)$ equalization circuit units 504. The comparators 10 have decision thresholds different from each other. The first comparator 10 has the first decision threshold between the first value and the second value of the PAM$2^n$ signal, and the second comparator 10 has the second decision threshold between the second value and the third value of the PAM$2^n$ signal. The $(2^n-1)$-th comparator 10 has the $(2^n-1)$-th decision threshold between the $(2^n-1)$-th value and the $2^n$-th value of the PAM$2^n$ signal.

The $(2^n-1)$ equalization circuit units 504 each include one latch 20, and the latch circuit 200 includes the $(2^n-1)$ latches 20 in the $(2^n-1)$ equalization circuit units 504. The latch circuit 200 includes, for the respective $(2^n-1)$ comparators 10, the latches 20 configured to latch results of comparison by the $(2^n-1)$ comparators 10.

The $(2^n-1)$ equalization circuit units 504 each include one switch unit 40, and the switch circuit 400 includes the $(2^n-1)$ switch units 40 in the $(2^n-1)$ equalization circuit units 504. The switch circuit 400 includes, for the respective $(2^n-1)$ latches 20, the switch units 40 controlled to be turned on and off by output signals from the $(2^n-1)$ latches 20.

The $(2^n-1)$ equalization circuit units 504 each include one threshold setting circuit 30, and the setting circuit 300 includes the $(2^n-1)$ threshold setting circuits 30 in the $(2^n-1)$ equalization circuit units 504. The setting circuit 300 includes, for the respective $(2^n-1)$ comparators 10, threshold setting circuits configured to set the decision thresholds of the $(2^n-1)$ comparators 10 in accordance with threshold control signals Vc1 to Vc$(2^n-1)$ supplied from the outside of the equalizer 9.

The comparators 10 and the latches 20 each operate in synchronization with a clock signal CLK1 and a clock signal CLKX1. The clock signal CLK1 and the clock signal CLKX1 are inverted with respect to each other. Each threshold setting circuit 30 operates in synchronization with the clock signal CLK1 for driving the comparator 10.

Tenth Embodiment

Figure 27:
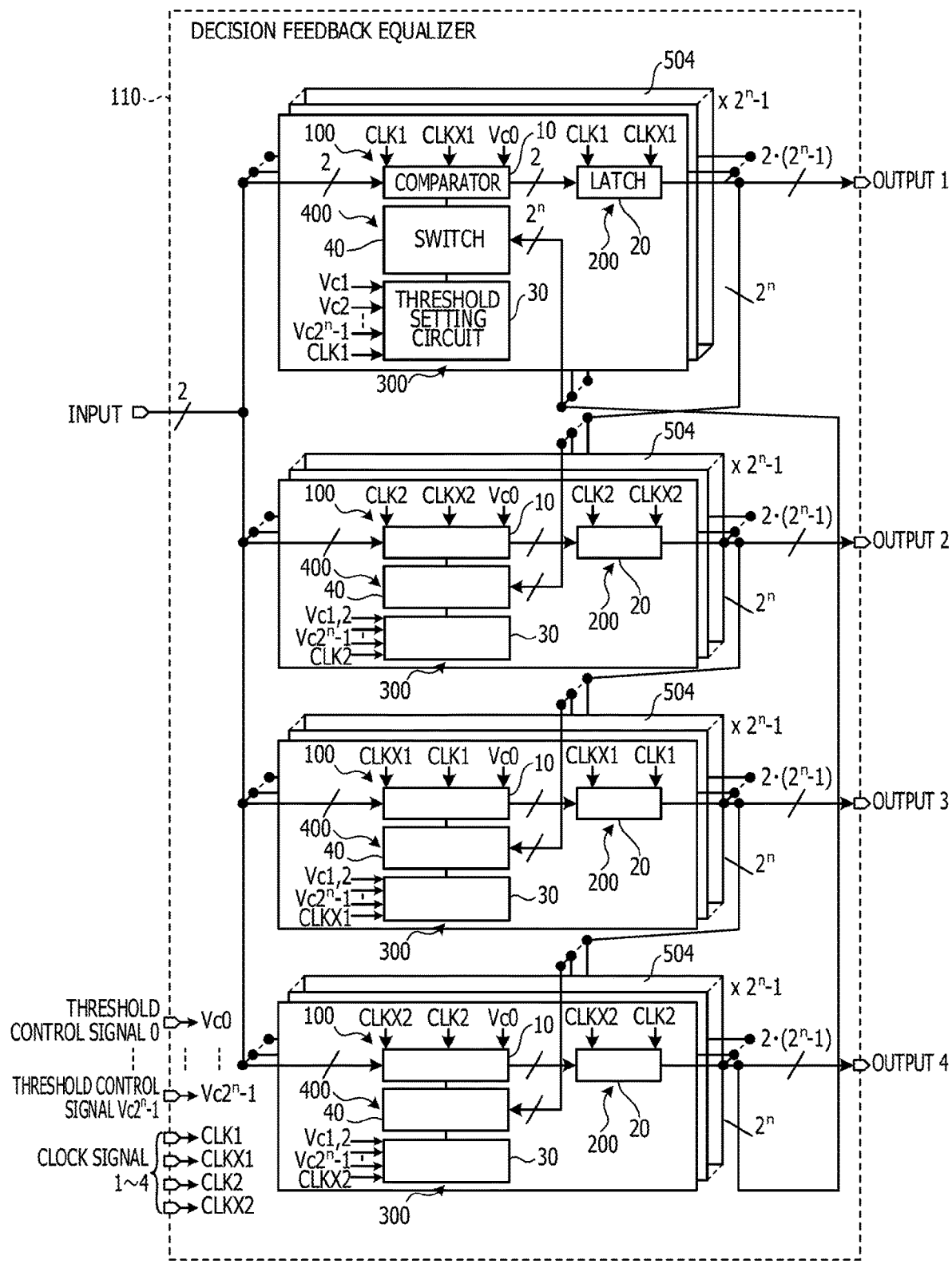
FIG. 27 is a diagram illustrating an exemplary configuration of a decision feedback equalizer according to a tenth embodiment.

FIG. 27 is a diagram illustrating an exemplary configuration of a decision feedback equalizer according to a tenth embodiment. Description of any configuration and effect of the ninth embodiment same as those of the above-described embodiments is omitted with reference to the above description.

In the first to eighth embodiments, each equalizer is a half-rate DFE having a two-parallel time interleaved configuration. However, this equalizer 110 is a quarter-rate DFE having a four-parallel time interleaved configuration. With the four-parallel time interleaved configuration, the frequencies of the clock signals CLK and CLKX can be decreased as compared to those in a two-parallel time interleaved configuration.

The equalizer 110 has a configuration for detecting the value of a $2^n$-valued (n is a natural number) pulse amplitude modulation signal (PAM$2^n$ signal). The equalizer 110 includes four-parallel groups of the $(2^n-1)$ equalization circuit units 504 to detect the values of the PAM$2^n$ signal.

The equalizer 110 includes the comparison circuit 100, the latch circuit 200, the switch circuit 400, and the setting circuit 300.

Latch output signals of the ($2^n$−1) equalization circuit units 504 of the first group are returned to the switch units 40 of the switch circuits 400 of the ($2^n$−1) equalization circuit units 504 of the second group. Latch output signals of the ($2^n$−1) equalization circuit units 504 of the second group are returned to the switch units 40 of the switch circuits 400 of the ($2^n$−1) equalization circuit units 504 of the third group. Latch output signals of the ($2^n$−1) equalization circuit units 504 of the third group are returned to the switch units 40 of the switch circuits 400 of the ($2^n$−1) equalization circuit units 504 of the fourth group. Latch output signals of the ($2^n$−1) equalization circuit units 504 of the fourth group are returned to the switch units 40 of the switch circuits 400 of the ($2^n$−1) equalization circuit units 504 of the first group.

The comparators 10 and the latches 20 of the first group and the third group operate in synchronization with a clock signal CLK1 and a clock signal CLKX1. The clock signal CLK1 and the clock signal CLKX1 are inverted to each other. Each threshold setting circuit 30 of the first group operates in synchronization with the clock signal CLK1 for driving the comparator 10 of the first group. Each threshold setting circuit 30 of the third group operates in synchronization with the clock signal CLKX1 for driving the comparator 10 of the third group.

The comparators 10 and the latches 20 of the second group and the fourth group operate in synchronization with a clock signal CLK2 and a clock signal CLKX2. The clock signal CLK2 and the clock signal CLKX2 are inverted to each other. Each threshold setting circuit 30 of the second group operates in synchronization with the clock signal CLK2 for driving the comparator 10 of the second group. Each threshold setting circuit 30 of the fourth group operates in synchronization with the clock signal CLKX2 for driving the comparator 10 of the fourth group.

The embodiments of a decision feedback equalizer and an interconnect circuit are described above, but are not limited to the above description. The scope of the embodiments includes various kinds of deformation and modification such as combination and replacement with part or all of any other embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A decision feedback equalizer for canceling of inter-symbol interference (ISI), the decision feedback equalizer comprising:
   a comparison circuit configured to receive a differential-input including a first input signal and a second input signal, the first input signal being an input signal inverted with respect to the second input signal, the comparison circuit including a first comparison circuit and a second comparison circuit;
   a latch circuit including a first latch circuit and a second latch circuit, the first latch circuit being configured to latch a result of comparison by the first comparison circuit, the second latch circuit being configured to latch a result of comparison by the second comparison circuit;
   a setting circuit including a first setting circuit and a second setting circuit, the first setting circuit being configured to set a first decision threshold of the first comparison circuit in accordance with a control signal, the second setting circuit being configured to set a second decision threshold of the second comparison circuit in accordance with the control signal; and
   a switch circuit including a first switch circuit and a second switch circuit, the first switch circuit being configured to be controlled to be turned on and off by an output signal from the second latch circuit, the second switch circuit being configured to be turned on and off by an output signal from the first latch circuit,
   the first setting circuit is configured to be connected in parallel with an input stage of the first comparison circuit through the first switch circuit and operate in synchronization with a first clock signal for driving the first comparison circuit,
   the second setting circuit is configured to be connected in parallel with an input stage of the second comparison circuit through the second switch circuit and operate in synchronization with a second clock signal for driving the second comparison circuit, the second clock signal being a clock signal inverted with respect to the first clock signal.

2. The decision feedback equalizer according to claim 1, wherein the setting circuit is configured to control a threshold adjustment transistor in accordance with the control signal, the threshold adjustment transistor being coupled to the input stage via the switch circuit in parallel.

3. The decision feedback equalizer according to claim 2, wherein the setting circuit is configured to control the threshold adjustment transistor by using control voltage having a voltage value that linearly changes with the control signal.

4. The decision feedback equalizer according to claim 3, wherein the setting circuit includes a digital-analog converter configured to convert the control signal that is digital into the control voltage that is analog.

5. The decision feedback equalizer according to claim 1, wherein
   the comparison circuit includes an offset adjustment circuit connected with the input stage, and
   the offset adjustment circuit is configured to adjust an offset of the decision threshold.

6. The decision feedback equalizer according to claim 1, wherein the input stage includes a P-channel differential pair.

7. The decision feedback equalizer according to claim 1, wherein the switch circuit includes a complementary switch, the complementary switch being configured to be controlled to be turned on and off by the output signal from the latch circuit.

8. The decision feedback equalizer according to claim 1, wherein the latch circuit is configured not to be controlled by a clock signal.

9. The decision feedback equalizer according to claim 1, further comprising a time interleaved configuration.

10. The decision feedback equalizer according to claim 1, further comprising a two-parallel or four-parallel time interleaved configuration.

11. The decision feedback equalizer according to claim 1, wherein
the comparison circuit includes ($2^n-1$) or $2\times(2^n-1)$ comparators, each comparator being configured to compare $2^n$-valued (n is a natural number) pulse amplitude modulation signals,
the latch circuit includes ($2^n-1$) or $2\times(2^n-1)$ latch elements, each latch element being configured to latch a result of comparison by the comparator,
the setting circuit includes ($2^n-1$) or $2\times(2^n-1)$ threshold setting circuits, each threshold setting circuit being configured to set the decision threshold of the comparator, and
the switch circuit includes ($2^n-1$) or $2\times(2^n-1)$ switch elements, each switch element being configured to be controlled to be turned on and off by the output signal from the latch element.

12. The decision feedback equalizer according to claim 11, wherein the value n is two.

13. The decision feedback equalizer according to claim 11, wherein the value n is three.

14. An interconnect circuit comprising:
a transmission device; and
a reception device, the reception device includes a decision feedback equalizer, the decision feedback equalizer being configured to shape a signal transmitted from the transmission device,
the decision feedback equalizer includes
a comparison circuit configured to receive a differential-input including a first input signal and a second input signal, the first input signal being an input signal inverted with respect to the second input signal, the comparison circuit including a first comparison circuit and a second comparison circuit,
a latch circuit including a first latch circuit and a second latch circuit, the first latch circuit being configured to latch a result of comparison by the first comparison circuit, the second latch circuit being configured to latch a result of comparison by the second comparison circuit,
a setting circuit including a first setting circuit and a second setting circuit, the first setting circuit being configured to set a first decision threshold of the first comparison circuit in accordance with a control signal, the second setting circuit being configured to set a second decision threshold of the second comparison circuit in accordance with the control signal,
a switch circuit including a first switch circuit and a second switch circuit, the first switch circuit being configured to be controlled to be turned on and off by an output signal from the second latch circuit, the second switch circuit being configured to be turned on and off by an output signal from the first latch circuit, and
the first setting circuit is configured to be connected in parallel with an input stage of the first comparison circuit through the first switch circuit and operate in synchronization with a first clock signal for driving the first comparison circuit,
the second setting circuit is configured to be connected in parallel with an input stage of the second comparison circuit through the second switch circuit and operate in synchronization with a second clock signal for driving the second comparison circuit, the second clock signal being a clock signal inverted with respect to the first clock signal.

* * * * *